(12) United States Patent
Yang et al.

(10) Patent No.: US 11,894,471 B2
(45) Date of Patent: Feb. 6, 2024

(54) PHOTOELECTRIC CHIP, MANUFACTURING METHOD AND INSTALLATION METHOD

(71) Applicant: PHOGRAIN TECHNOLOGY (SHENZHEN) CO., LTD., Guangdong (CN)

(72) Inventors: Yanwei Yang, Guangdong (CN); Ying Li, Guangdong (CN); Hongliang Liu, Guangdong (CN); Ge Liu, Guangdong (CN); Yan Zou, Guangdong (CN)

(73) Assignee: PHOGRAIN TECHNOLOGY (SHENZHEN) CO., LTD., Guangdong (CN)

( * ) Notice: Subject to any disclaimer, the term of this patent is extended or adjusted under 35 U.S.C. 154(b) by 272 days.

(21) Appl. No.: 17/358,029

(22) Filed: Jun. 25, 2021

(65) Prior Publication Data
US 2021/0328080 A1   Oct. 21, 2021

Related U.S. Application Data

(63) Continuation of application No. PCT/CN2019/114636, filed on Oct. 31, 2019.

(30) Foreign Application Priority Data

Dec. 25, 2018  (CN) .......................... 201811587822.9
Dec. 25, 2018  (CN) .......................... 201811587824.8

(51) Int. Cl.
*H01L 31/0216* (2014.01)
*H01L 31/0352* (2006.01)
*H01L 31/18* (2006.01)

(52) U.S. Cl.
CPC .... *H01L 31/02161* (2013.01); *H01L 31/0352* (2013.01); *H01L 31/18* (2013.01)

(58) Field of Classification Search
None
See application file for complete search history.

(56) References Cited

U.S. PATENT DOCUMENTS

| 5,877,492 A | 3/1999 | Fujieda et al. |
| 2003/0106988 A1 | 6/2003 | Severn |

(Continued)

FOREIGN PATENT DOCUMENTS

| CN | 1802756 | 7/2006 |
| CN | 108352422 | 7/2018 |

(Continued)

OTHER PUBLICATIONS

"Search Report of Europe Counterpart Application", dated Apr. 8, 2022, p. 1-p. 19.

(Continued)

*Primary Examiner* — Evren Seven
(74) *Attorney, Agent, or Firm* — JCIP GLOBAL INC.

(57) ABSTRACT

Provided are a photoelectric chip, a manufacturing method and an installation method, which relate to the field of optical communication and transmission technologies. The chip is provided with a light-splitting groove (3), and the light-splitting groove (3) runs through an absorption layer (2) of the chip; the back of the chip is a light-entering side; the light-splitting groove (3) is configured to transmit and split out part (151) of incident light (15), and the other part (152) of the incident light (15) enters the absorption layer (2) for photovoltaic conversion. The photoelectric chip can split light and monitor optical power of the incident light.

16 Claims, 22 Drawing Sheets

(56) References Cited

U.S. PATENT DOCUMENTS

2004/0202417 A1    10/2004  Watanabe et al.
2009/0165840 A1*   7/2009   Murata ........... H01L 31/022483
                                                                257/E31.043
2013/0292706 A1*  11/2013   Costello ................ B05D 1/322
                                                                257/82

FOREIGN PATENT DOCUMENTS

| CN | 109671795 | 4/2019 |
| CN | 109801984 | 5/2019 |
| CN | 209401635 | 9/2019 |
| CN | 209401645 | 9/2019 |
| EP | 2413372 | 2/2012 |
| EP | 3270423 | 1/2018 |
| JP | H0697597 | 4/1994 |
| JP | 2013058656 | 3/2013 |
| WO | 2013055008 | 4/2013 |
| WO | 2016081476 | 5/2016 |

OTHER PUBLICATIONS

"Office Action of Japan Counterpart Application", dated Jun. 14, 2022, p. 1-p. 3.
Office Action of Japan Counterpart Application, with English translation thereof, dated Nov. 15, 2022, pp. 1-4.

\* cited by examiner

PHOTOELECTRIC CHIP, MANUFACTURING METHOD AND INSTALLATION METHOD

CROSS-REFERENCE TO RELATED APPLICATION

This application is a continuation of international application of PCT application serial no. PCT/CN2019/114636 filed on Oct. 31, 2019, which claims the priority benefit of China application no. 201811587822.9 filed on Dec. 25, 2018 and China application no. 201811587824.8 filed on Dec. 25, 2018. The entirety of each of the above mentioned patent applications is hereby incorporated by reference herein and made a part of this specification.

BACKGROUND

Technical Field

The present invention relates to the field of optical communication and transmission technologies, and in particular to a photoelectric chip, a manufacturing method and an installation method.

Description of Related Art

Before an optical signal emitted by a laser is transmitted through an optical fiber and enters a passive planar lightwave circuit (PLC), an optical splitter is usually required to split out part (for example, 5%) of the optical signal and send this part of signal to an additional optical power monitoring receiver chip in order to monitor optical power entering the passive planar lightwave circuit. The remaining part (for example, 95%) of the optical signal is coupled to the passive planar lightwave circuit through the optical fiber for transmission.

It can be understood that, because two independent devices, namely, the optical splitter and the optical power monitoring receiver chip need to be installed on an optical link, and a structure composed of the optical fiber and two optical fiber splices is further required between the two devices, the optical splitter and the optical power monitoring receiver chip also need their own fixing positions in general cases. In addition, a current laser system is usually a composite optical path, and the practice of the prior art has caused a large system structure volume, high operation difficulty, and a high cost.

SUMMARY

To solve the above-mentioned technical problems in the prior art, a main objective of the present invention is to provide a photoelectric chip, a manufacturing method and an installation method. The chip can not only implement light splitting, but also implement optical power monitoring.

To solve the above-mentioned technical problems, an embodiment of the present invention provides a photoelectric chip, which is a back-incident photoelectric chip, where the chip is provided with a light-splitting groove, and the light-splitting groove runs through an absorption layer of the chip; and the back of the chip is a light-entering side; the light-splitting groove is configured to transmit and split out one part of incident light, and the other part of the incident light enters the absorption layer for photovoltaic conversion.

The photoelectric chip provided in the present invention is provided with the light-splitting groove, and the light-splitting groove runs through the absorption layer of the chip. When incident light enters the chip from one side of the back of the chip, one part of the light exits through the light-splitting groove, and this part of light can pass through the chip losslessly through the light-splitting groove without passing through the absorption layer, and can continue highly efficient optical signal transmission; and the other part of the light passes through the absorption layer for photoelectric conversion to generate photo-generated carriers, thereby effectively monitoring optical power of the incident light. Therefore, the photoelectric chip provided in the present invention can split light and monitor the optical power of the incident light.

Further, the chip further includes a top layer, where the top layer is located on one side of the front of the absorption layer; the light-splitting groove is open in a direction away from the back of the chip and runs through the top layer, and a photosensitive area of the chip is formed in the top layer; an inner end of the photosensitive area is connected to the absorption layer, and an outer end of the photosensitive area is connected to a first electrode of the chip; the photosensitive area corresponds to an area in the absorption layer for performing photoelectric conversion; and the first electrode is located on the front of the chip.

Further, the chip further includes a substrate, where the substrate is located on one side of the back of the absorption layer; and the back of the chip is further provided with a second electrode, and the second electrode is arranged on the outer edge of the back surface of the substrate.

Further, a buffer layer is further arranged between the substrate and the absorption layer, and an inner end of the light-splitting groove is located at the buffer layer.

Further, the back of the chip is provided with a light-entering anti-reflection coating to increase an incidence rate with the light-entering anti-reflection coating, and an area of the light-entering anti-reflection coating is greater than a cross-sectional area of the light-splitting groove parallel with a surface of the chip.

Further, the inner end of the light-splitting groove is provided with a light-transmitting anti-reflection coating to increase a light-exiting transmittance with the light-transmitting anti-reflection coating.

Further, cross sections of the first electrode and the photosensitive area in a direction parallel with the surface of the chip are both annular, and the light-splitting groove and the light-entering anti-reflection coating are both circular; the light-splitting groove, the first electrode, the photosensitive area and the light-entering anti-reflection coating are all concentric circles, each with a circle center alignment error being less than 20 μm; the light-splitting groove has a diameter of 50 μm-250 μm; the first electrode has an inner diameter not less than the diameter of the light-splitting groove, and the first electrode has an outer diameter greater than the diameter of the light-splitting groove and is 60 μm-1000 μm; and the photosensitive area has an inner diameter not less than the diameter of the light-splitting groove, and the photosensitive area has an outer diameter not greater than the diameter of the light-entering anti-reflection coating.

Further, the light-splitting groove runs through a part of the chip or the entire chip.

An embodiment of the present invention further provides a manufacturing method for a photoelectric chip, where the method is used to manufacture the photoelectric chip described in any one of the above-mentioned embodiments, and includes: forming a chip including an absorption layer; and forming a light-splitting groove on the chip, where the light-splitting groove runs through the absorption layer.

An embodiment of the present invention further provides an installation method for a photoelectric chip, where the method is used to install the photoelectric chip described in any one of the above-mentioned embodiments, and includes: pre-positioning the photoelectric chip relative to a light source; detecting optical power of split light transmitted through a light-splitting groove to correct a splitting ratio of the pre-positioned chip; fixedly installing the chip and the light source if the splitting ratio meets a preset value; and adjusting the splitting ratio to the preset value by adjusting a distance between the light source and the chip if the splitting ratio does not meet the preset value.

An embodiment of the present invention further provides a photoelectric chip, which is a back-incident array photoelectric chip, where the chip includes multiple light splitting monitoring units, and each of the light splitting monitoring units includes a light-transmitting groove and a photosensitive area; the light-transmitting groove is open towards any surface of the chip and runs through an absorption layer of the chip, the photosensitive area is formed in a top layer of the chip, and one end of the photosensitive area is connected to the absorption layer of the chip; and an area of the absorption layer corresponding to the photosensitive area is a photoelectric conversion area; and the back of the chip is used as a light-entering side, and multiple beams of incident light are emitted to the chip; one part of each beam of incident light is transmitted and split out from the light-transmitting groove of the corresponding light splitting monitoring unit, and the other part of each beam of incident light enters the photoelectric conversion area of the corresponding light splitting monitoring unit for photoelectric conversion.

The photoelectric chip provided in the embodiment of the present invention is provided with the multiple light splitting monitoring units, and each of the light splitting monitoring units includes a light-transmitting groove and a photosensitive area. The multiple beams of incident light are emitted to the chip. One part of each beam of incident light is transmitted and split out from the light-transmitting groove of the corresponding light splitting monitoring unit, can pass through the chip losslessly through the light-splitting groove without passing through the absorption layer, and can continue optical signal transmission. The other part of each beam of incident light enters the photoelectric conversion area of the corresponding light splitting monitoring unit for photoelectric conversion, so that the chip can separately perform splitting and optical power monitoring on the multiple beams of incident light. Therefore, an optical path system using the chip does not need to use a large number of optical splitters, thereby greatly reducing a size and cost of the optical path system.

Further, each of the light splitting monitoring units further includes a first electrode, where the first electrode is arranged on the front of the chip and connected to the other end of the corresponding photosensitive area; the first electrodes of the multiple light splitting monitoring units are insulated from each other; and at least one second electrode is arranged on the back of the chip, and the second electrode is connected to the substrate of the chip.

Further, an edge of the front of the chip is further provided with multiple electrode pads in one-to-one correspondences with the light splitting monitoring units, and the first electrode of each of the light splitting monitoring units is electrically connected to the corresponding electrode pad through one corresponding electrode connecting wire; the multiple electrode connecting wires are insulated from each other; and the multiple electrode pads are insulated from each other.

Further, a buffer layer is further arranged between the substrate and the absorption layer, the light-splitting groove is open towards the front of the chip and further runs through the top layer, and an inner end of the light-splitting groove is located at the buffer layer.

Further, a center-to-center spacing between adjacent two of the light splitting monitoring units is greater than 100 μm and less than 5000 μm.

Further, a center-to-center spacing between adjacent two of the electrode pads is greater than 30 μm and less than 1000 μm; and a spacing between adjacent two of the electrode connecting wires is greater than 5 μm.

Further, the light-transmitting groove runs through a part of the chip or the entire chip.

Further, the back of the chip is provided with multiple light-entering anti-reflection coatings in one-to-one correspondences with the light splitting monitoring units, and an area of each of the light-entering anti-reflection coatings is greater than the sum of cross-sectional areas of both the light-transmitting groove and the photosensitive area of the corresponding light splitting monitoring unit in a direction parallel with the surface of the chip.

Further, the inner end of the light-transmitting groove is provided with a light-exiting anti-reflection coating.

An embodiment of the present invention further provides a manufacturing method for a photoelectric chip, where the method is used to manufacture the photoelectric chip described in any one of the above-mentioned embodiments, and includes: forming an absorption layer and a top layer; doping a P-type material in multiple places on the top layer, and diffusing the P-type material in each place to the absorption layer to form multiple photosensitive areas; and forming multiple light-transmitting grooves on the chip, where the multiple light-transmitting grooves run through the absorption layer.

BRIEF DESCRIPTION OF THE DRAWINGS

The advantages of the above-mentioned and/or additional aspects of the present invention become apparent and easy to understand from the description of the embodiments in conjunction with the following accompanying drawings, where.

Figure 1:
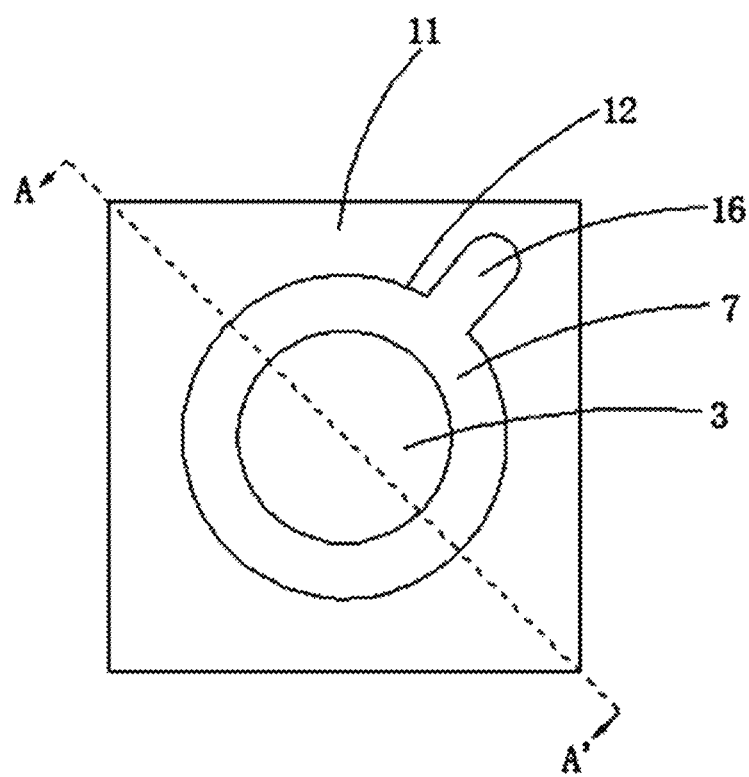
FIG. 1 is a front view illustrating a photoelectric chip according to an embodiment of the present invention.

The correspondences between the drawing reference signs and component names in FIG. 1 to FIG. 28 are as follows: 1. Buffer layer; 2. absorption layer; 3. light-splitting groove; 4. light-entering anti-reflection coating; 5. top layer; 6. photosensitive area; 7. first electrode; 8. substrate; 9; second electrode; 10. second electrode through hole; 11. passivation coating; 12. first electrode through hole; 13. light-transmitting anti-reflection coating; 14. photosensitive area window; 15. incident light; 151. one part of light; 152. the other part of light; 16. electrode pad; 17. substrate; 18. buffer layer; 19. absorption layer; 20. top layer; 21. light-transmitting groove; 22. photosensitive area; 23. first electrode; 24. electrode pad; 25. electrode connecting wire; 26. second electrode; 27. light-entering anti-reflection coating; 28. light-exiting anti-reflection coating; 29. passivation coating; 30. incident light; 31. one part of incident light; 32. the other part of incident light; 33. photosensitive area window.

DESCRIPTION OF THE EMBODIMENTS

To make the objectives, technical solutions and advantages of the embodiments of the present application clearer, the following clearly and completely describes the technical solutions in the embodiments of the present application with reference to accompanying drawings in the embodiments of the present application. Apparently, the described embodiments are some rather than all of the embodiments of the present application. All other embodiments obtained by a person of ordinary skill in the art based on the embodiments of the present application without creative efforts shall fall within the protection scope of the present application.

Figure 2:
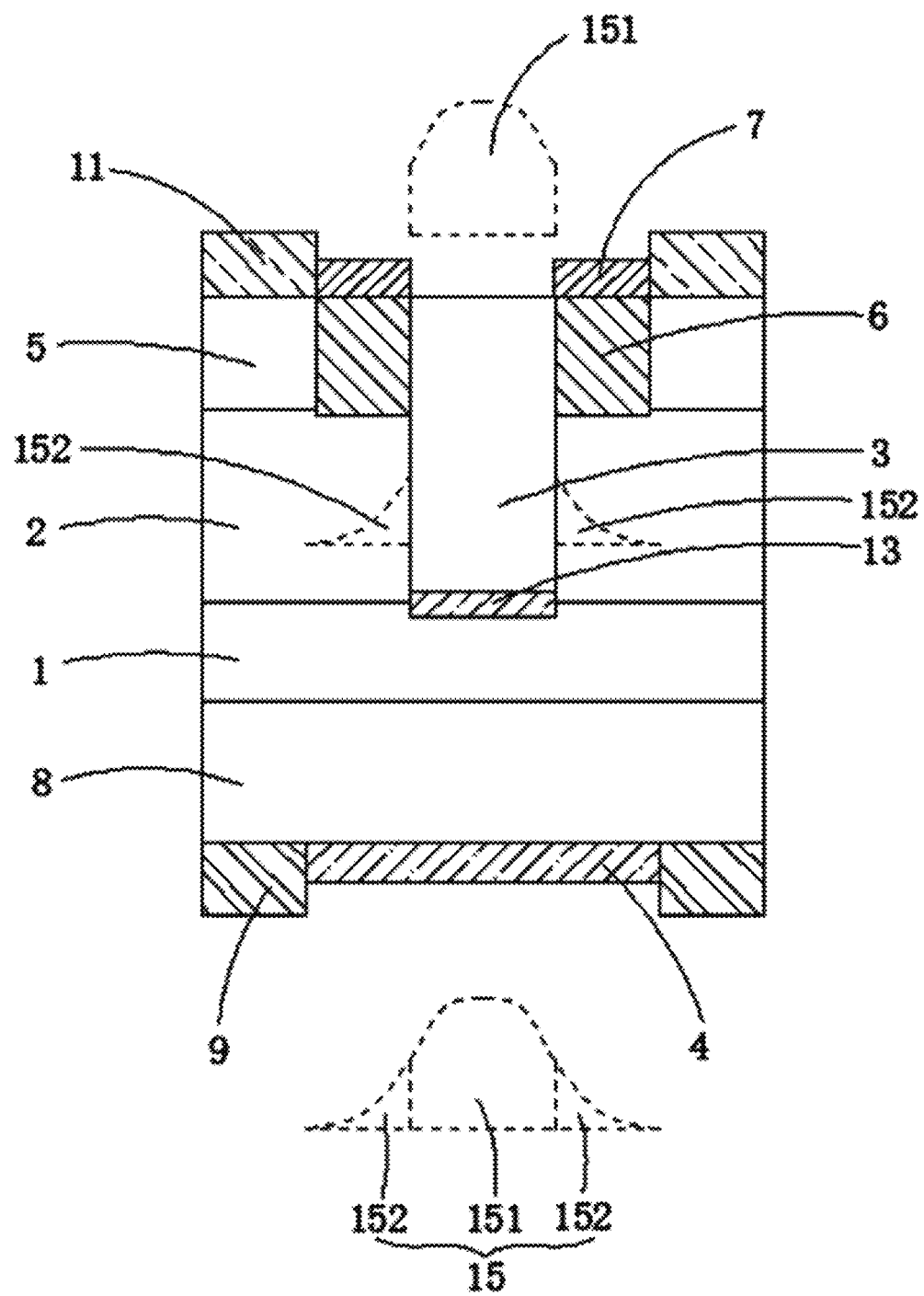
FIG. 2 is a sectional view illustrating a chip shown in FIG. 1 along A-A'.

Referring to FIG. 1 and FIG. 2, the present invention provides a photoelectric chip, which is a back-incident photoelectric chip, where the chip is provided with a light-splitting groove 3. The light-splitting groove 3 runs through an absorption layer 2 of the chip. The absorption layer 2 may be made of an InGaAs material. A person skilled in the art knows that multiple choices of materials are available for the absorption layer 2 based on different incident light, which is not specifically limited here.

The light-splitting groove 3 is configured to transmit and split out one part of incident light, and the other part of the incident light enters the absorption layer 2 for photovoltaic conversion.

In this embodiment, the back of the chip is used as a light-entering side. Specifically, the back of the chip is provided with a light-entering anti-reflection coating 4. The light-entering anti-reflection coating 4 is configured to reduce reflection of light, thereby increasing an incidence rate. An orthographic projection of the light-splitting groove 3 on the back of the chip has an area overlapped with the light-entering anti-reflection coating 4, i.e., after the incident light enters the chip through the light-entering anti-reflection coating 4, one part of the light can be emitted from the light-splitting groove 3. Further, the orthographic projection of the light-splitting groove 3 on the back of the chip falls within the light-entering anti-reflection coating 4, i.e., an area of the light-entering anti-reflection coating 4 is greater than a cross-sectional area of the light-splitting groove 3 parallel with a surface of the chip, so that more light is transmitted and split out from an inner end of the light-splitting groove 3, thereby reducing an optical power loss.

The photoelectric chip further includes a top layer 5, where the top layer 5 is located on one side of the front of the absorption layer 2, i.e., the top layer 5 is closer to the front of the chip than the absorption layer 2. A photosensitive area 6 of the chip is formed in the top layer 5. An inner end of the photosensitive area 6 is connected to the absorption layer 2, and an outer end of the photosensitive area 6 is connected to a first electrode 7 of the chip. The photosensitive area 6 corresponds to an area in the absorption layer 2 for performing photoelectric conversion, i.e., an orthographic projection of the photosensitive area 6 on the back of the chip has an area overlapped with the light-entering anti-reflection coating 4, so that after the incident light enters the chip through the light-entering anti-reflection coating 4, one part of the light can undergo photoelectric conversion in the absorption layer 2.

The light-splitting groove 3 runs through a part of the chip or the entire chip.

In this embodiment, the light-splitting groove 3 is open in a direction away from the back of the chip and runs through the top layer 5, Because the top layer 5 is relatively thin, a process of forming the light-splitting groove 3 is simple, and the chip is easy to manufacture.

In another embodiment, the light-splitting groove 3 may be open towards the back of the chip.

In another embodiment, the light-splitting groove 3 is formed only in the absorption layer 2 but is not open towards any surface of the chip.

In this embodiment, the orthographic projection of the photosensitive area 6 on the back of the chip falls within the light-entering anti-reflection coating 4, so that a photoelectric conversion effect is good, and thus an effect of monitoring optical power of the incident light is good.

In this embodiment, the first electrode 7 is located on the front of the chip, i.e., on a surface of the top layer 5 that faces away from the absorption layer 2.

Referring to FIG. 1, an electrode pad 16 is further arranged on the front of the chip and electrically connected to the first electrode 7.

Specifically, the top layer 5 is made of an indium phosphide (InP) material.

Figure 3:
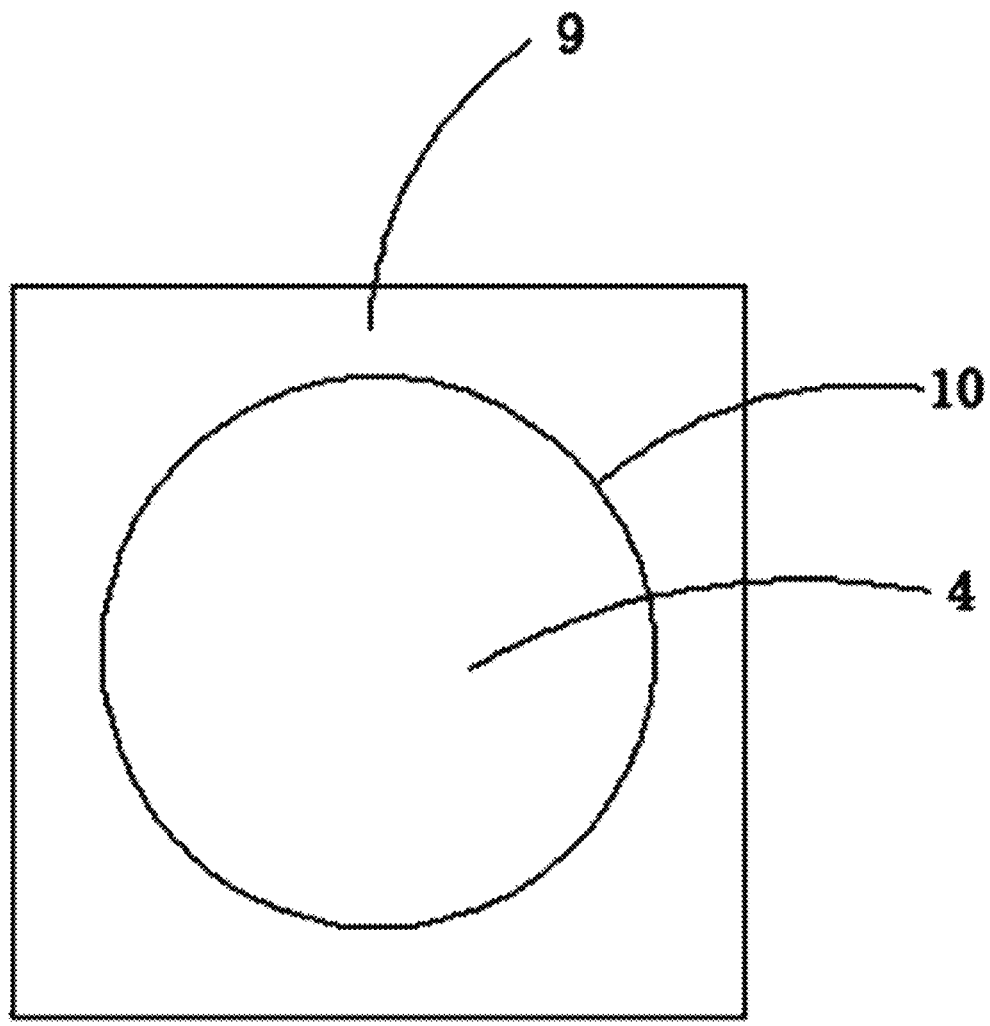
FIG. 3 is a rear view illustrating the chip shown in FIG. 1.

Further referring to FIG. 3, the photoelectric chip further includes a substrate 8, where the substrate 8 is located on one side of the back of the absorption layer, i.e., the substrate 8 is located on one side of the absorption layer 2 that faces away from the top layer 5. The back of the chip is further provided with a second electrode 9, and the second electrode 9 is arranged outside a surface on a back side of the substrate 8, i.e., the second electrode 9 is arranged on a surface of the substrate 8 that faces away from the absorption layer 2. The light-entering anti-reflection coating 4 is located on a surface of the substrate 8 that faces away from the absorption layer 2.

The first electrode 7 of the chip provided in the present invention is located on the front of the chip, and the second electrode 9 is located on the back of the chip. In practice, when the chip is powered up, the electrode pad 16 is electrically connected to a first circuit board through a bond wire. The back of the chip is provided with a second circuit board that is transparent (to avoid affecting entry of the incident light into the chip). The second circuit board is provided with a circuit trace, and the second electrode 9 is electrically connected to the circuit trace on the second circuit board. Then the first circuit board and the second circuit board are electrically connected to two poles of a power supply to power up the chip.

Specifically, the substrate 8 is made of a sulfur (S)-doped InP material.

In this embodiment, as shown in FIG. 3, the second electrode 9 is further provided with a second electrode through hole 10 for arranging the light-entering anti-reflection coating 4.

In this embodiment, as shown in FIG. 2, a buffer layer 1 may be further optionally arranged between the substrate 8 and the absorption layer 2, and the inner end of the light-splitting groove 3 is optionally located at the buffer layer 1. Because the top layer 5 and the absorption layer 2 are relatively thin, the light-splitting groove 3 is shallow, and the process difficulty is low, facilitating manufacturing.

Figure 4:
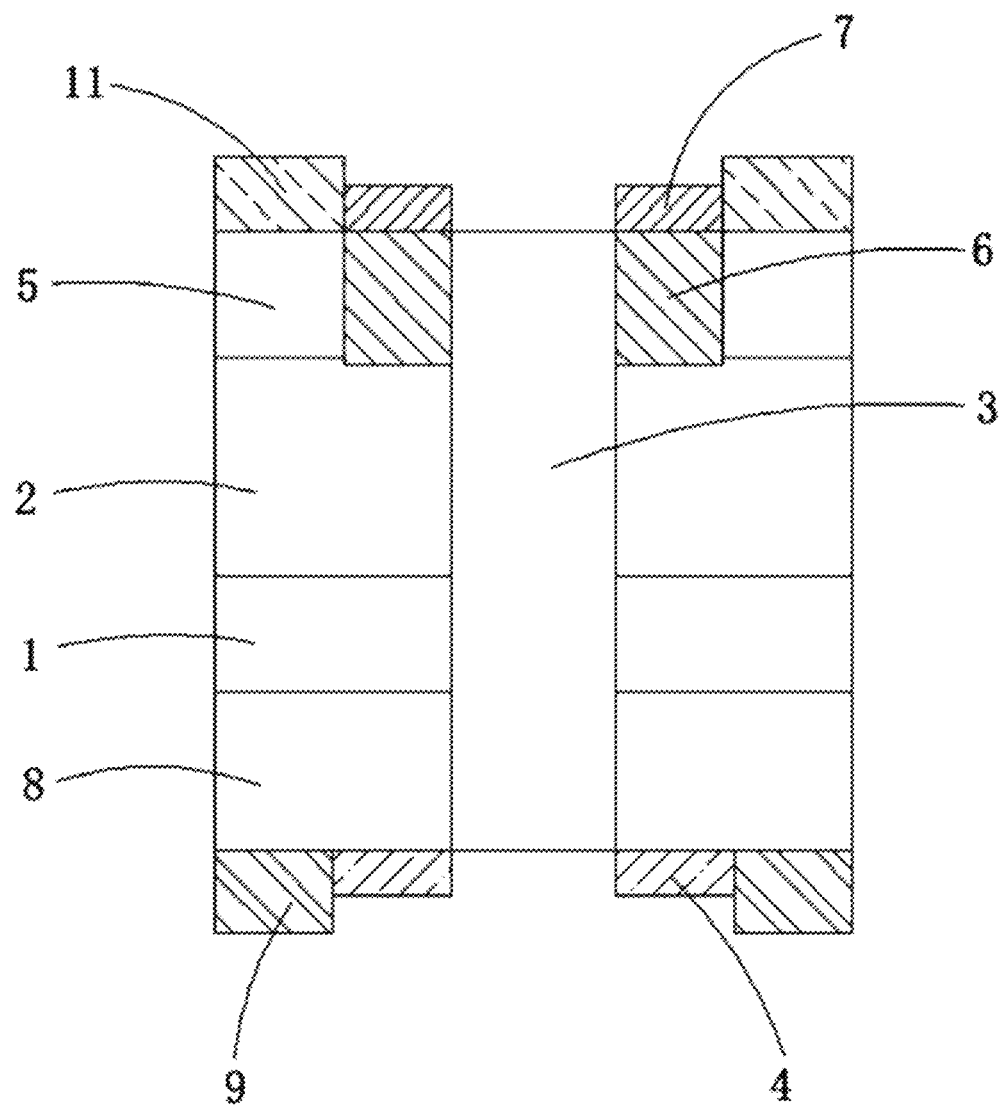
FIG. 4 is a sectional view illustrating a photoelectric chip according to another embodiment of the present invention.

In another embodiment, referring to FIG. 4, the light-splitting groove 3 may run through the entire chip, i.e., the light-splitting groove 3 runs through the top layer 5, the absorption layer 2, the buffer layer 1, the substrate 8 and the light-entering anti-reflection coating 4 and forms a light-splitting through hole.

Specifically, the buffer layer 1 is made of an InP material.

The photoelectric chip further includes a passivation coating 11, where the passivation coating 11 is arranged on the front of the chip, i.e., the passivation coating 11 is located on the surface of the top layer 5 that faces away from the absorption layer 2. The passivation coating 11 is provided with a first electrode through hole 12 for arranging the first electrode 7.

The inner end of the light-splitting groove 3 is provided with a light-transmitting anti-reflection coating 13, and the light-transmitting anti-reflection coating 13 is configured to reduce reflection of light to increase a light-exiting transmittance.

The photosensitive area 6 and the first electrode 7 are both annular and surround the light-emitting groove 3, an orthographic projection of the photosensitive area 6 on the first electrode 7 falls within the first electrode 7, and an orthographic projection of the first electrode 7 on the back of the chip falls within the light-entering anti-reflection coating 4.

In this embodiment, cross sections of the first electrode 7 and the photosensitive area 6 in a direction parallel with the surface of the chip are both annular, and the light-splitting groove 3 and the light-entering anti-reflection coating 4 are circular; and the light-splitting groove 3, the first electrode 7, the photosensitive area 6 and the light-entering anti-reflection coating 4 are all concentric circles, each with a circle center alignment error being less than 20 μm. The light-splitting groove 3 has a diameter of 50 μm-250 μm; the first electrode 7 has an inner diameter not less than the diameter of the light-splitting groove 3, and the first electrode 7 has an outer diameter greater than the diameter of the light-splitting groove 3 and is 60 μm-1000 μm; the first electrode 7 has an outer diameter not greater than the diameter of the light-entering anti-reflection coating 4; the photosensitive area 6 has an inner diameter not greater than that of the first electrode 7, and the photosensitive area 6 has an outer diameter not greater than that of the first electrode 7. The inner diameter of the photosensitive area 6 is not less than the diameter of the light-splitting groove 3, and the outer diameter of the photosensitive area 6 is not greater than the diameter of the light-entering anti-reflection coating 4.

The present invention further provides an installation method for a photoelectric chip, including: pre-positioning the photoelectric chip relative to a light source, where the light source is configured to emit light to the back-incident photoelectric chip; detecting optical power of light transmitted through and split out from a light-splitting groove 3 of the photoelectric chip to correct a splitting ratio of the pre-positioned chip; fixedly installing the chip and the light source if the splitting ratio meets a preset value; and adjusting the splitting ratio to the preset value by adjusting a distance between the light source and the chip if the splitting ratio does not meet the preset value.

Still referring to FIG. 2, a working principle of the photoelectric chip provided in the present invention is as follows:

A reverse bias voltage is applied to the chip through the first electrode 7 and the second electrode 9 for the chip to operate. Incident light 15 enters the chip from the light-entering anti-reflection coating 4 on the back of the chip. One part 151 of light passes through the substrate 8 and the buffer layer 1 and then exits from the light-transmitting anti-reflection coating 13. This part of light can pass through the chip while maintaining a high transmittance, and can continue highly efficient optical signal transmission. The other part 152 of the light passes through the substrate 8 and the buffer layer 1 and enters the absorption layer 2 for photoelectric conversion to form a photocurrent, and then corresponding optical power is calculated by using a series of other external circuits and devices and displayed, so as to monitor the optical power of the incident light.

A light intensity of the incident light 15 generally exhibits a Gaussian distribution, i.e., the light intensity is strong in the middle and weak on both sides, most of the light can exit through the inner end of the light-splitting groove 3, and thus most of the light can continue optical signal transmission. Only a small part of the light enters the absorption layer 2 for photoelectric conversion to monitor the optical power.

A proportion of light that needs to be split out from the incident light is determined based on actual needs. For example, in this embodiment, the proportion of light that needs to be split out from the incident light is 10%. When an optical link is installed, a detection element may be used to detect optical power of the light split out through the light-splitting groove. Because the total optical power of the incident light is known (the total optical power of an output of the light source is known, or the total optical power is measured separately), it can be determined whether the proportion of the light split out meets a requirement.

If the requirement is met, relevant components on the optical link may be fixed.

If the requirement is not met, the distance between the incident light source and the chip may be adjusted to adjust the proportion of the light split out.

After the proportion of the light split out from the incident light is determined, the remaining light may enter the absorption layer of the chip for photoelectric conversion to generate a photocurrent, and optical power of the remaining light is calculated based on the generated photocurrent, so as to monitor the optical power of the incident light. It may be considered that the splitting ratio has been determined after installation. The optical power of the part of the light that enters the chip to generate the photocurrent may directly represent a change rate of the optical power of the light source. If a real-time change value of the total optical power of the incident light is required subsequently, it may be chosen to obtain the value through conversion according to the light splitting ratio based on the optical power calculated from the photocurrent in the embodiment.

The present invention further provides an embodiment of a manufacturing method for a photoelectric chip, including the following steps.

Figure 5:
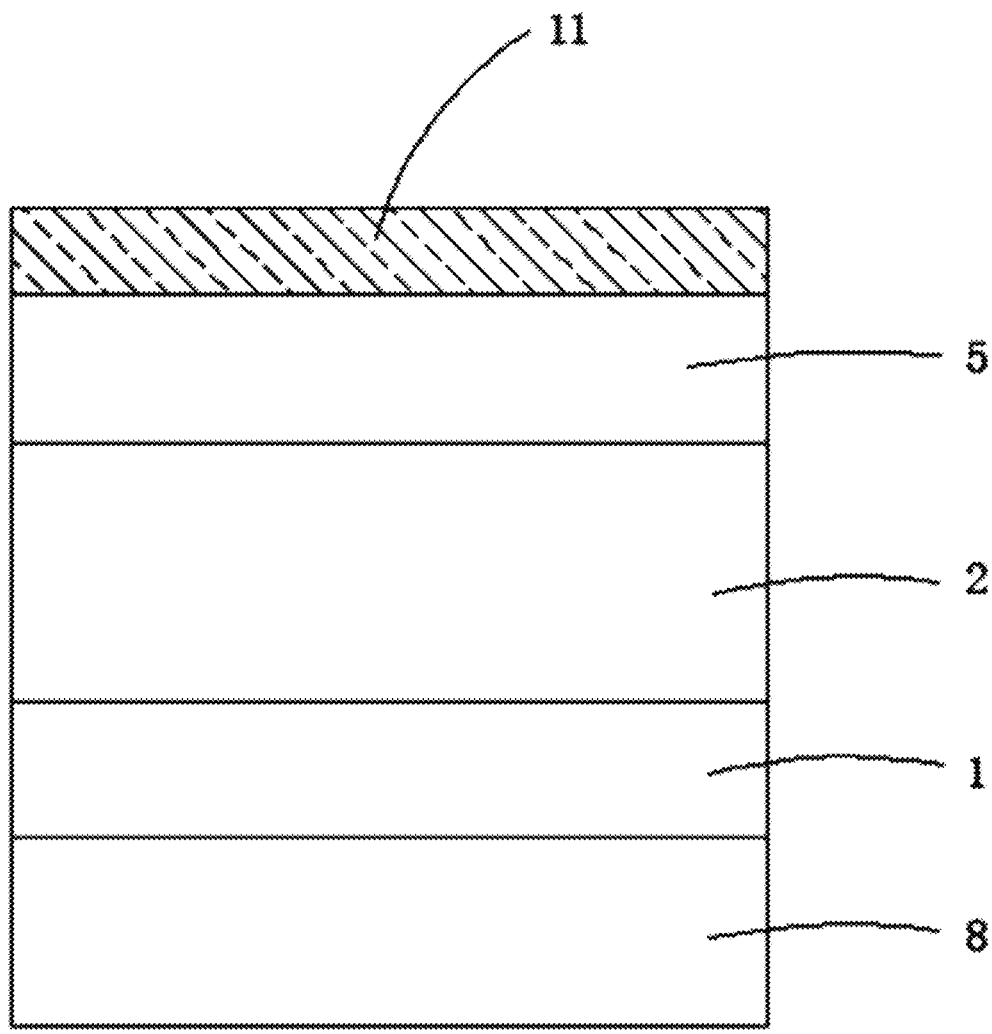
FIG. 5 is a schematic diagram illustrating growth of a substrate, a buffer layer, an absorption layer, a top layer and a passivation coating according to an embodiment of the present invention.

Referring to FIG. 5, a buffer layer 1, an absorption layer 2 and a top layer 5 are sequentially grown on a substrate 8. In this embodiment, meta-organic chemical vapor deposition (MOCVD) or other optional processes in the art may be used to sequentially grow the buffer layer 1, the absorption layer 2 and the top layer 5 on the substrate 8.

Step 2: referring to FIG. 5, a growing dielectric film process or other optional processes in the art may be optionally used to grow a passivation coating 11 on the front of the chip, i.e., the passivation coating 11 is located on a surface of the top layer 5 that faces away from the absorption layer 2. Specifically, the growing dielectric film process is plasma enhanced chemical vapor deposition (PECVD), and the passivation coating 11 is silicon dioxide ($SiO_2$) with a thickness greater than 5000 A or silicon nitride ($Si_3N_4$) with a thickness greater than 2000 A.

Figure 6:
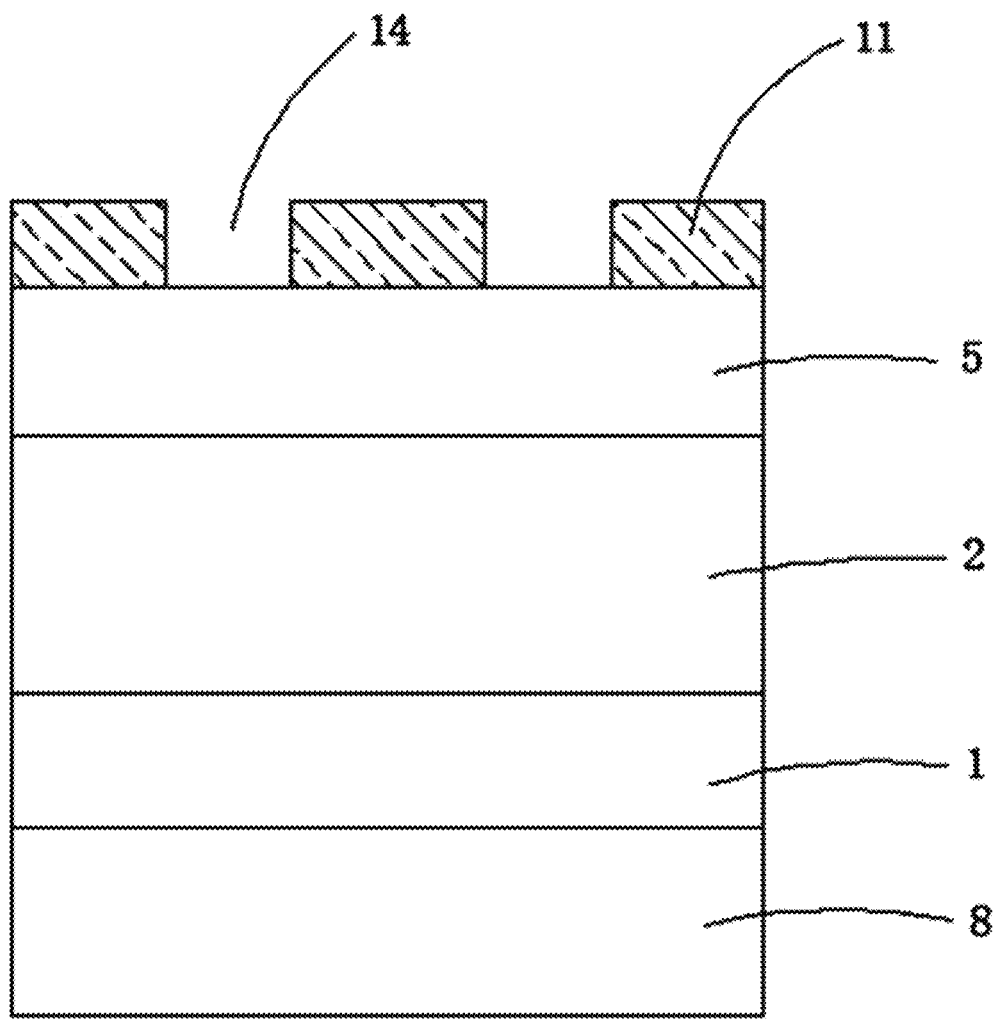
FIG. 6 is a schematic diagram illustrating photolithography and etching of a photosensitive area window according to an embodiment of the present invention.

Referring to FIG. 6, a photolithography and etching process is used to form a photosensitive area window 14 on the passivation coating 11 through photolithography and etching.

Figure 7:
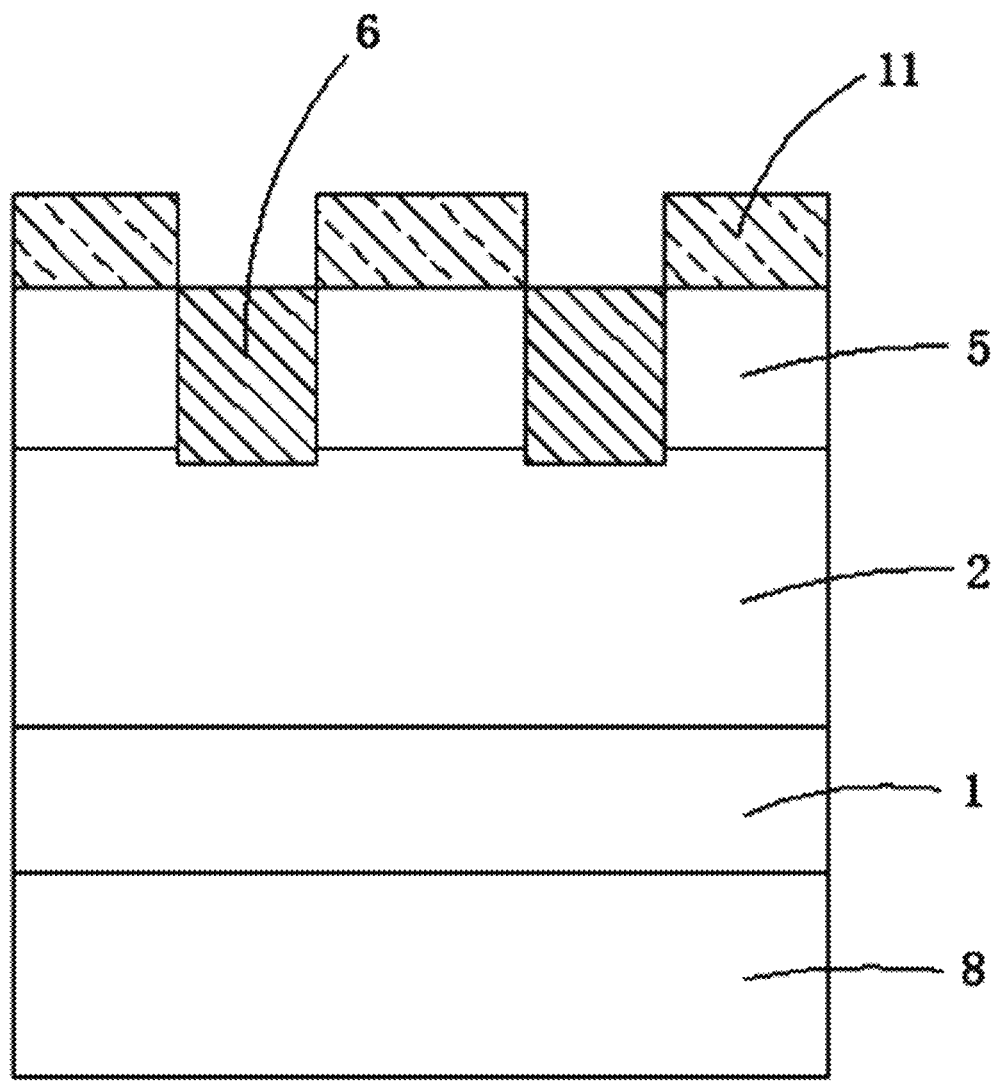
FIG. 7 is a schematic diagram illustrating a photosensitive area formed by diffusion according to an embodiment of the present invention.

Referring to FIG. 7, the chip is doped with a P-type material from the photosensitive area window 14 to form a photosensitive area 6, and a high temperature diffusion process is used to form a PN junction. Specifically, the photosensitive area 6 is formed in the top layer 5, and an inner end of the photosensitive area 6 is connected to the absorption layer 2; the chip is doped with the P-type material using a diffusion process, and a diffusion source is zinc phosphide ($Zn_3P_2$).

Figure 8:
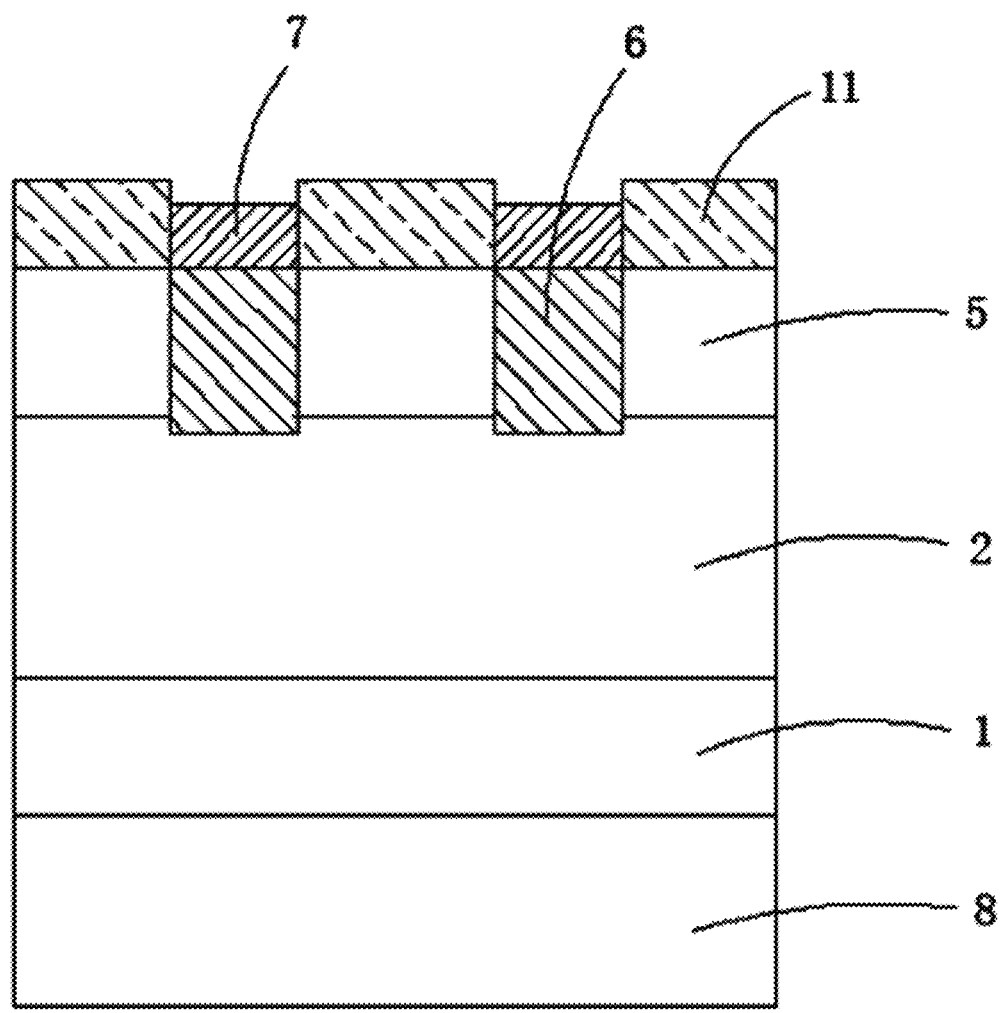
FIG. 8 is a schematic diagram illustrating manufacturing of a first electrode according to an embodiment of the present invention.

Referring to FIG. 8, a first electrode 7 is manufactured on the front of the chip.

Specifically, the first electrode 7 is manufactured by using an electron beam evaporation process, and the first electrode 7 is a TiPtAu metal electrode.

Figure 9:
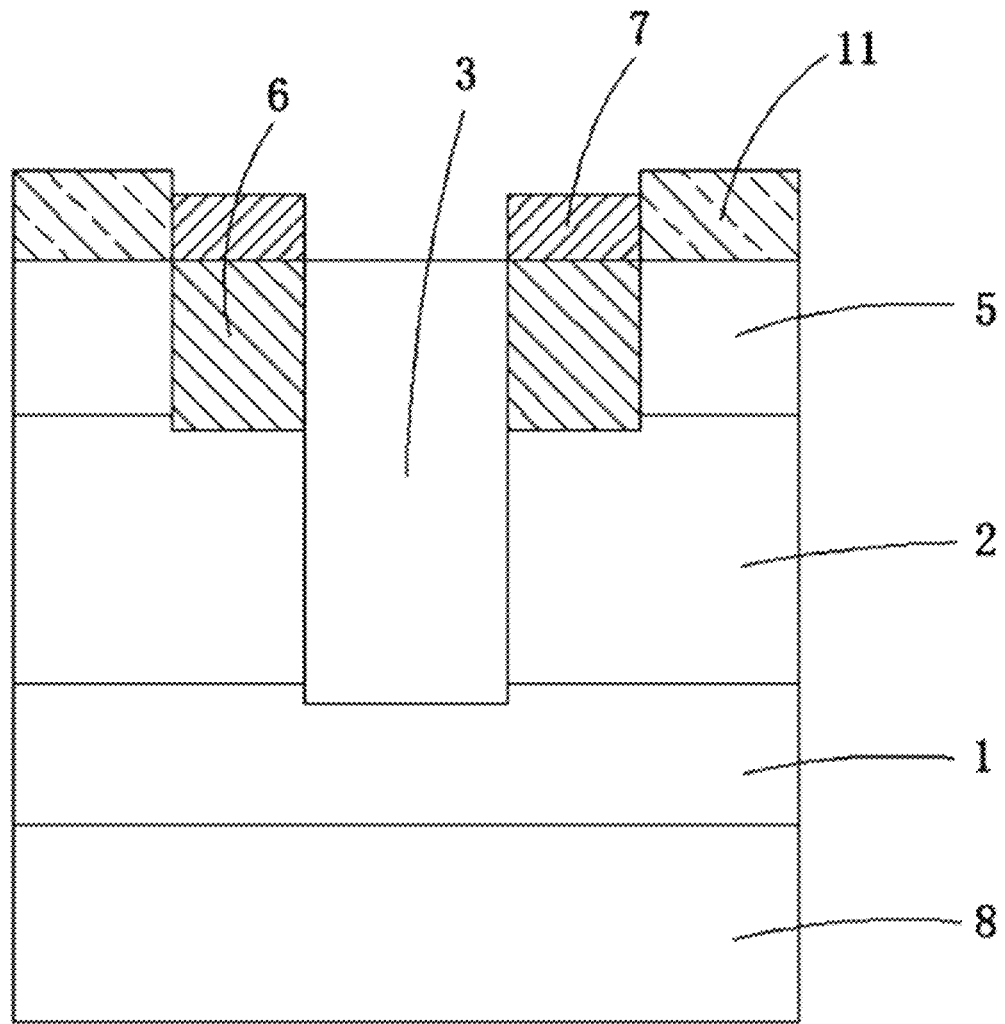
FIG. 9 is a schematic diagram illustrating forming of a light-splitting groove according to an embodiment of the present invention.

Referring to FIG. 9, a light-splitting groove 3 is formed on the chip, and the light-splitting groove 3 is open in a direction away from the back of the chip. The light-splitting groove 3 runs through the absorption layer 2, and an inner end of the light-splitting groove 3 is located at the buffer layer 1. Specifically, the light-splitting groove 3 is etched by using a wet etching process or a dry etching process.

Figure 10:
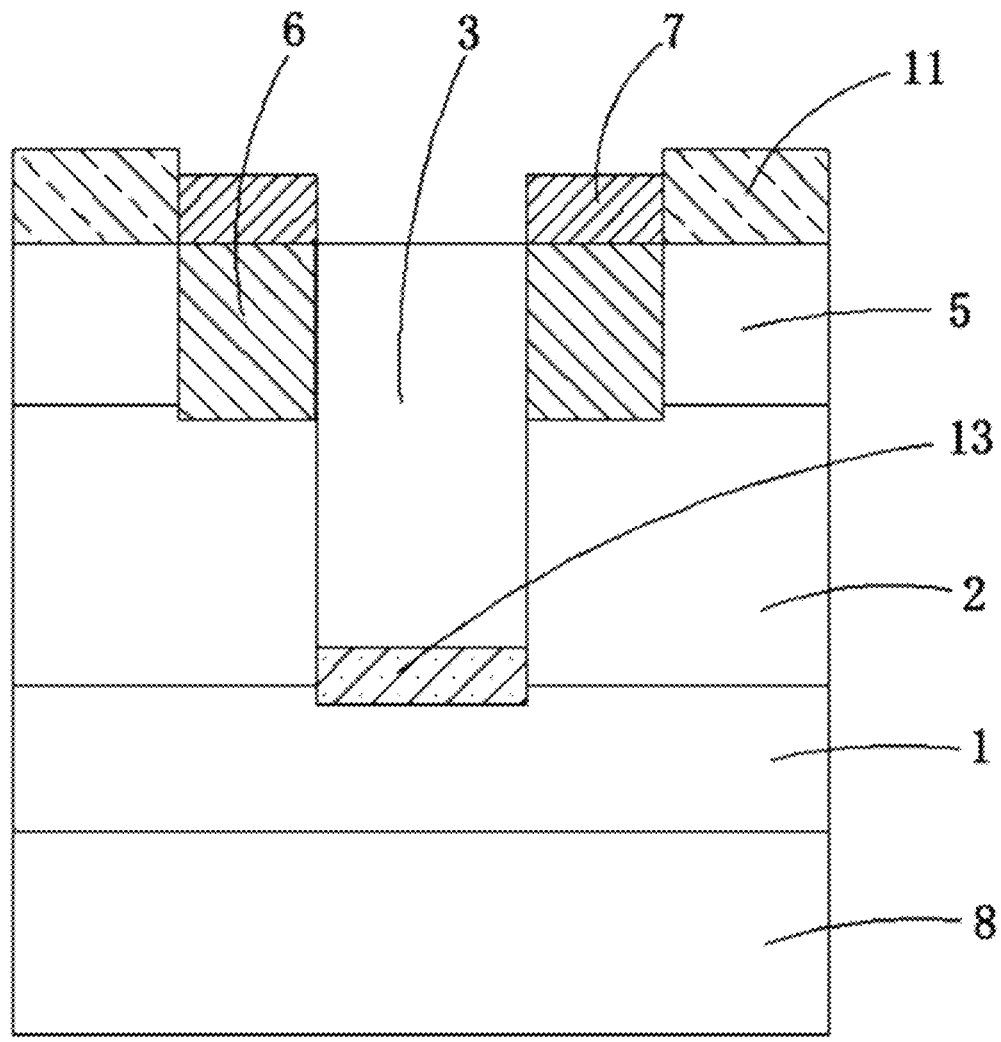
FIG. 10 is a schematic diagram illustrating growth of a light-transmitting anti-reflection coating according to an embodiment of the present invention.

Referring to FIG. 10, a light-transmitting anti-reflection coating 13 is grown at the inner end of the light-splitting groove 3. Specifically, PECVD is used to grow an anti-reflection coating on the front of the chip, photolithography and etching are performed on the anti-reflection coating, and the anti-reflection coating at the inner end of the light-splitting groove 3 is retained to form the light-transmitting anti-reflection coating 13.

The back of the chip is thinned and polished.

Figure 11:
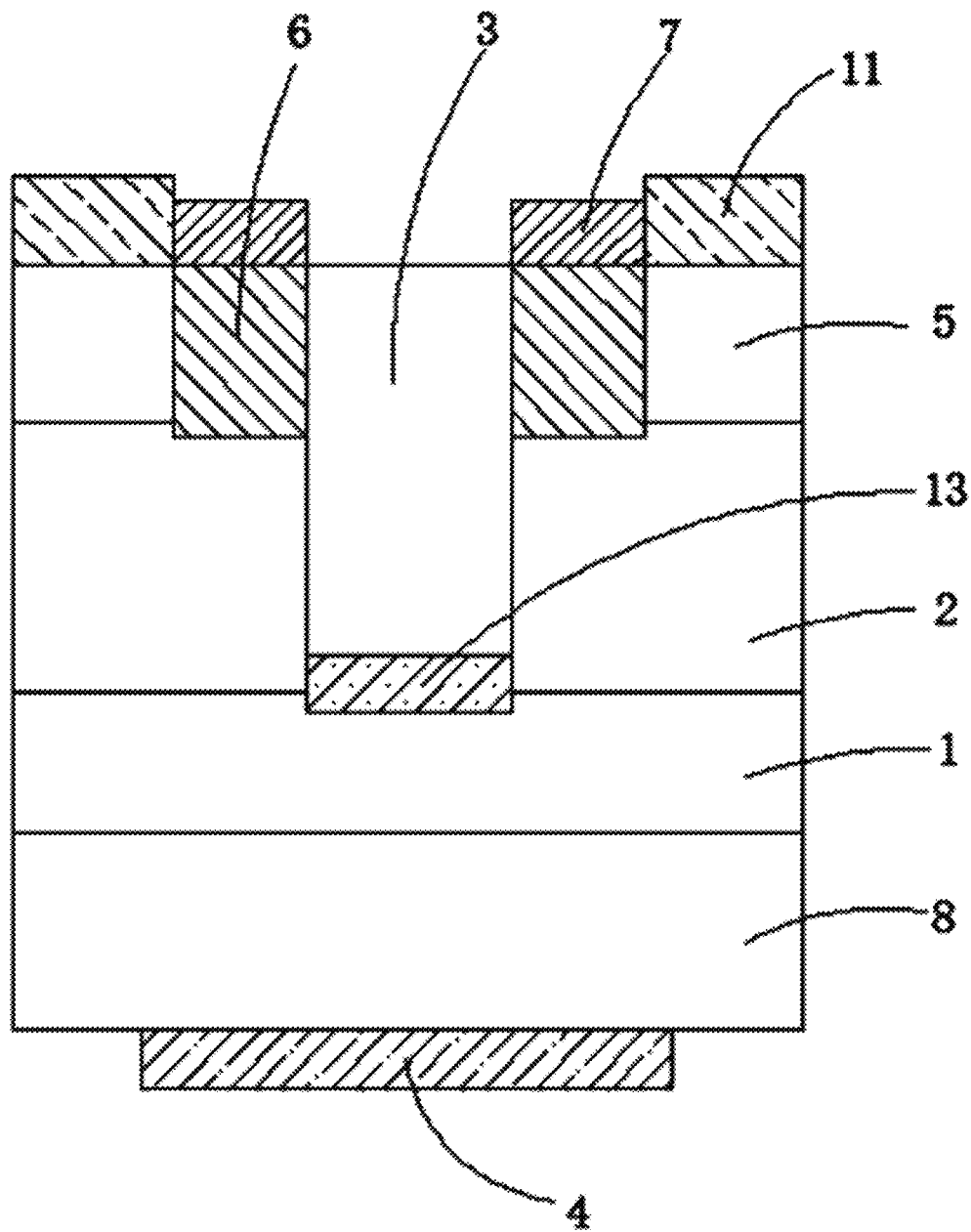
FIG. 11 is a schematic diagram illustrating growth of a light-entering anti-reflection coating according to an embodiment of the present invention.

Referring to FIG. 11, a light-entering anti-reflection coating 4 is grown on the back of the chip. Specifically, an anti-reflection coating is grown on the back of the chip, and photolithography is performed on the anti-reflection coating to form the light-entering anti-reflection coating 4.

Figure 12:
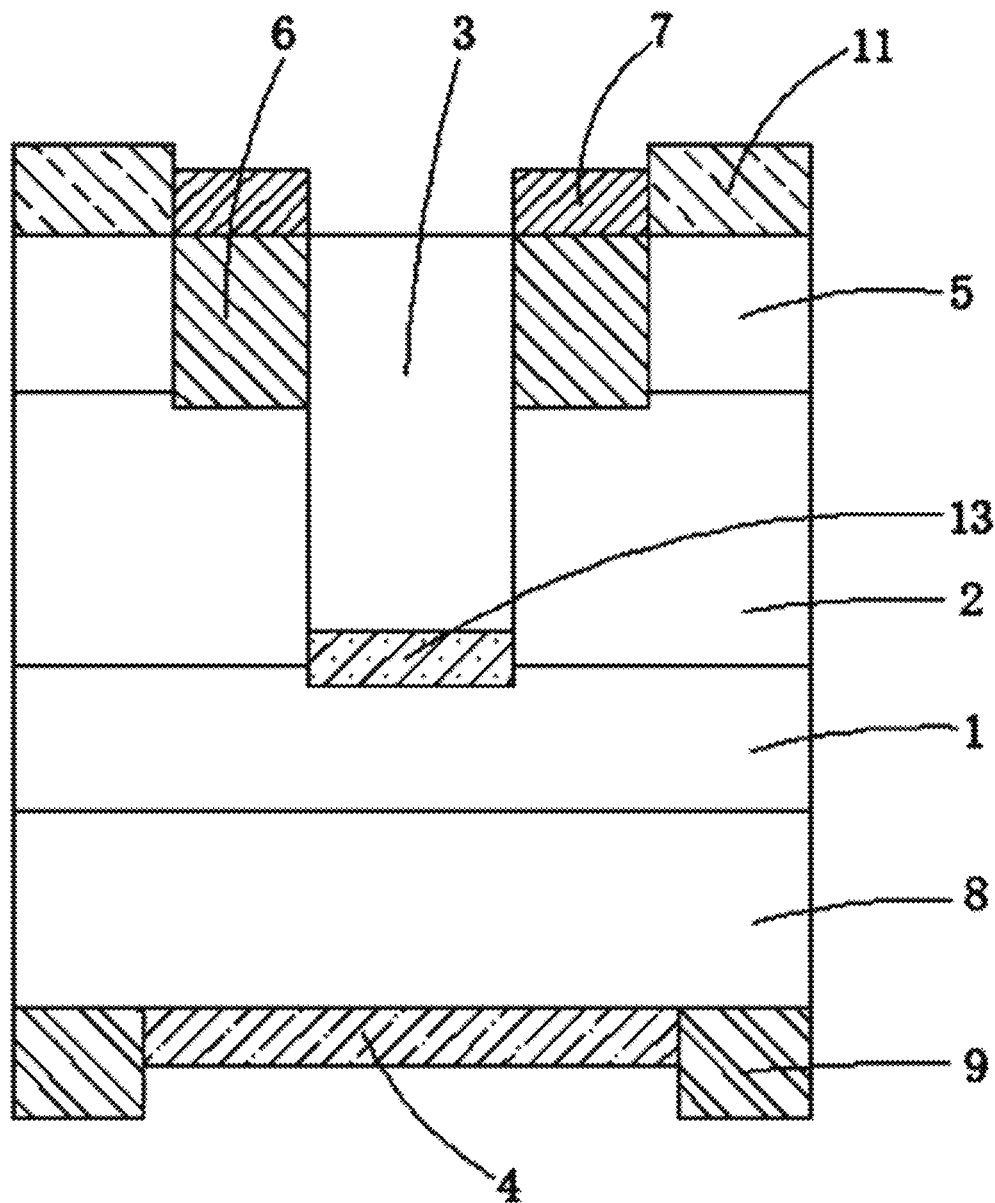
FIG. 12 is a schematic diagram illustrating manufacturing of a second electrode according to an embodiment of the present invention.
Figure 13:
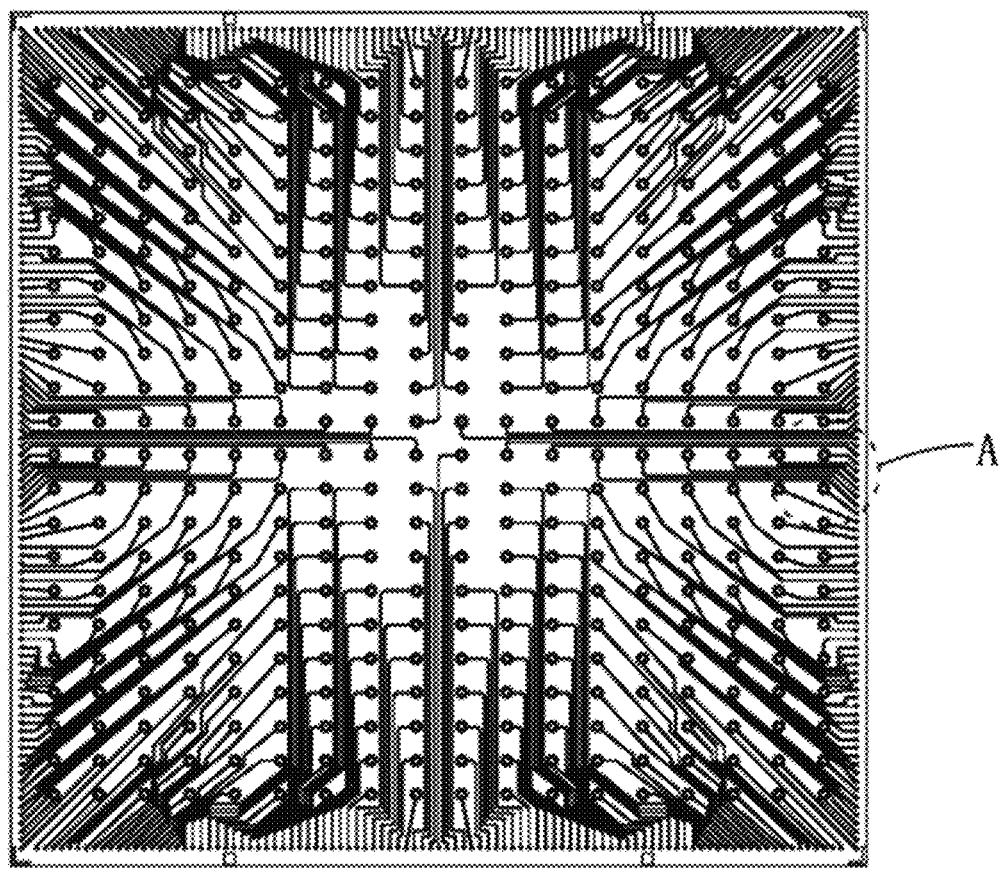
FIG. 13 is a front view illustrating a photoelectric chip according to an embodiment of the present invention.
Figure 14:
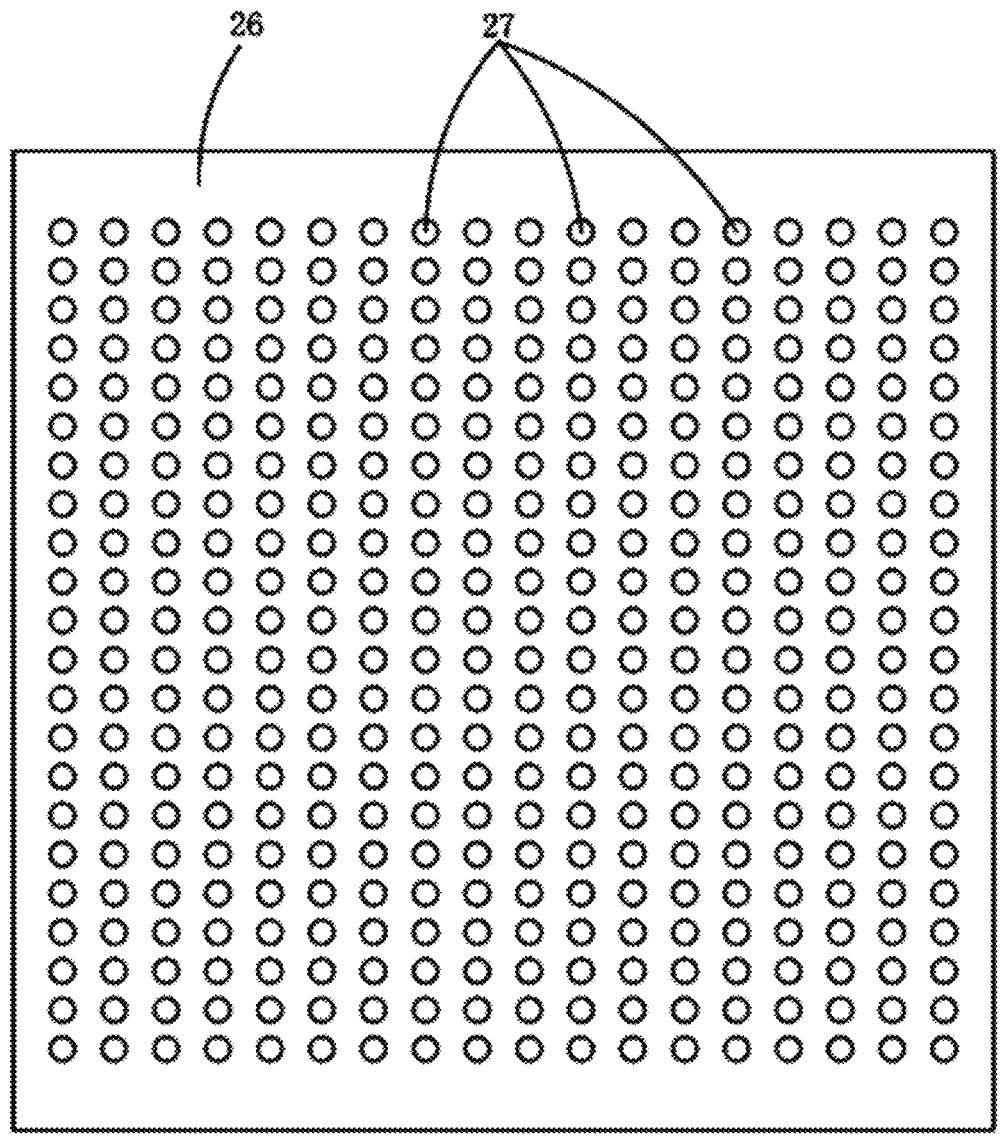
FIG. 14 is a rear view illustrating a photoelectric chip according to an embodiment of the present invention.
Figure 15:
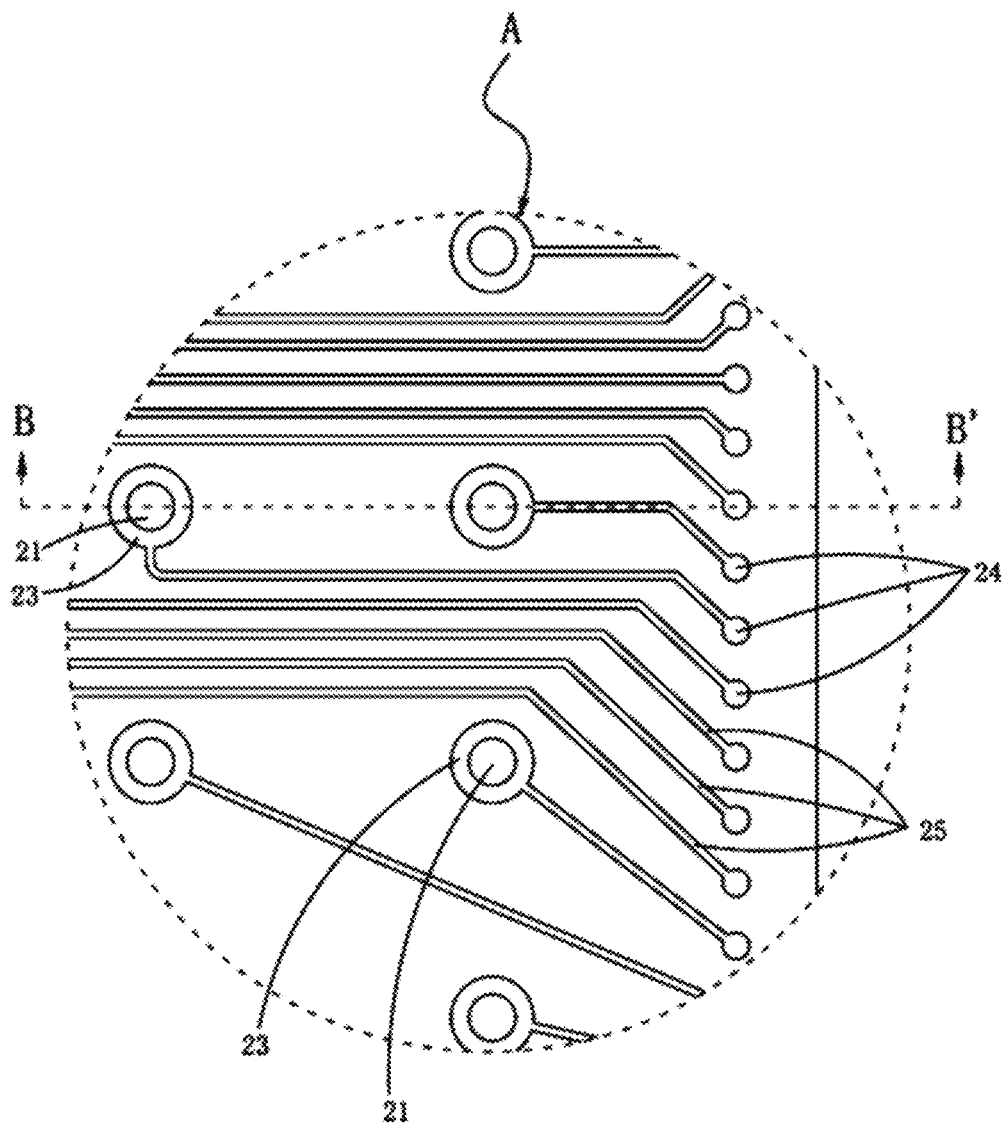
FIG. 15 is an enlarged view illustrating area A in the front view shown in FIG. 13.
Figure 16:
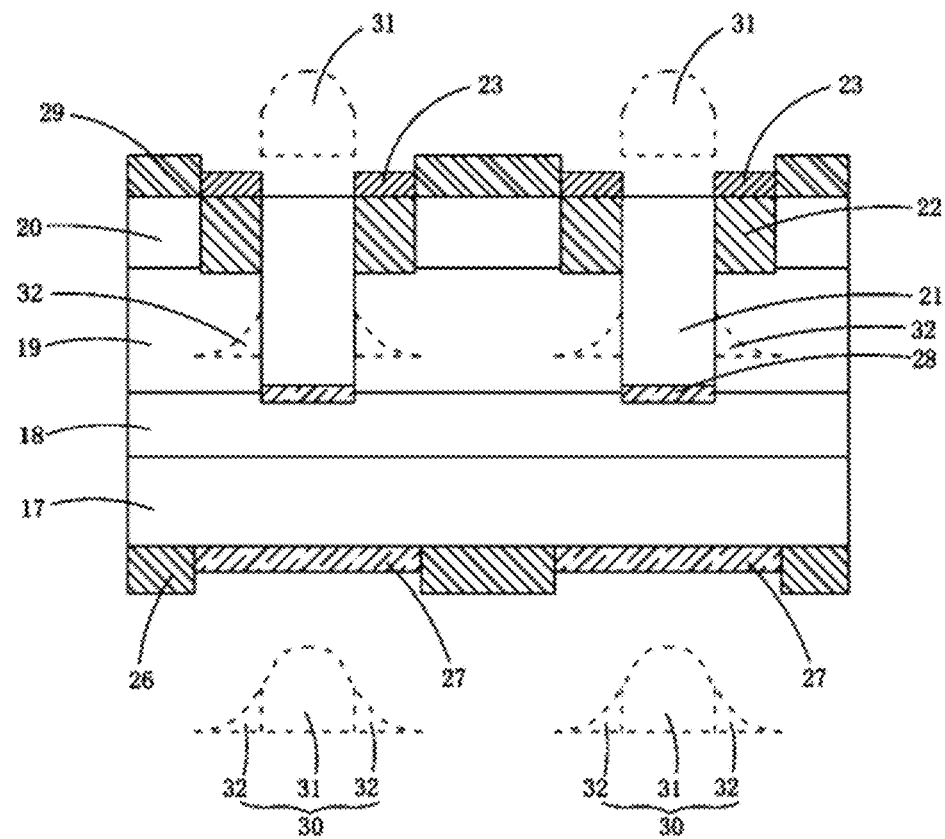
FIG. 16 is a partial sectional view of FIG. 15 along a direction B-B'.

Referring to FIG. 3 and FIG. 12, a second electrode 9 is manufactured on the back of the chip, and a second electrode through hole 10 for arranging the light-entering anti-reflection coating 4 is formed on the second electrode 9. Specifically, the second electrode 9 is manufactured by using the electron beam evaporation process, the second electrode 9 is a NiAu metal electrode, and the second electrode through hole 10 is formed by photolithography.

A contact resistance of the chip is reduced by using a high-temperature alloy process.

The photoelectric chip provided in the present invention is provided with the light-splitting groove 3, and the light-splitting groove 3 runs through the absorption layer 2 of the chip. When incident light enters the chip from one side of the back of the chip, one part of the light exits from the light-splitting groove 3, and this part of light passes through the chip losslessly through the light-splitting groove without passing through the absorption layer, and can continue highly efficient optical signal transmission. The other part of the light passes through the absorption layer 2 for photoelectric conversion to generate photo-generated carriers, thereby effectively monitoring optical power of the incident light. Therefore, the photoelectric chip provided in the present invention can split light and monitor the optical power of the incident light. In an optical path system using the photoelectric chip provided in the present invention, an optical splitter and other corresponding components are unnecessary, thereby reducing a size and cost of a structure of the optical path system. Because fewer components are installed, operation difficulty is reduced.

Referring to FIG. 13 to FIG. 16, the present invention provides a photoelectric chip, which is a back-incident array photoelectric chip. The chip includes a substrate 17, a buffer layer 18, an absorption layer 19 and a top layer 20 that are stacked in sequence. The substrate 17 is closer to the back of the chip than the top layer 20. In this embodiment, the substrate 17 is made of an S-doped InP material, the buffer layer 18 is made of an InP material, the absorption layer 19 is made of an InGaAs material, and the top layer 20 is made of an InP material.

The embodiment of the back-incident array chip provided in the present invention further includes multiple light splitting monitoring units. Specifically, a center-to-center spacing between adjacent two of the light splitting monitoring units is greater than 100 μm and less than 5000 μm.

Each of the light splitting monitoring units includes a light-transmitting groove 21, a photosensitive area 22 and a first electrode 23.

The light-transmitting groove 21 is open towards any surface of the chip and runs through the absorption layer 19 of the chip. The light-transmitting groove 21 runs through a part of the chip or the entire chip. In this embodiment, the light-transmitting groove 21 is open towards the front of the chip. The light-transmitting groove 21 further runs through the top layer 20, and an inner end thereof is located at the buffer layer 18. Because the top layer 20 and the absorption layer 19 are relatively thin, a process of forming the light-transmitting groove 21 is simple, and the chip is easy to manufacture and produce.

In another embodiment, the light-transmitting groove 21 may alternatively be open towards the back of the chip, for example, run through the substrate 17, the buffer layer 18 and the absorption layer 19.

Figure 17:
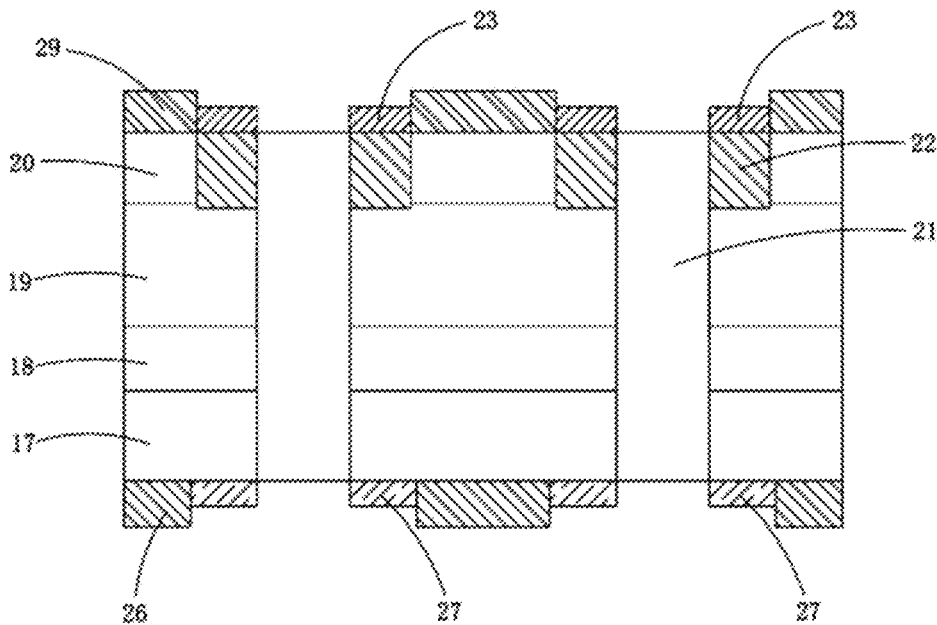
FIG. 17 is a partial sectional view illustrating another embodiment of a photoelectric chip according to in the present invention.

In another embodiment, referring to FIG. 17, the light-transmitting groove 21 runs through the entire chip and becomes a through hole.

The photosensitive area 22 is formed in the top layer 20 of the chip and one end thereof is connected to the absorption layer 19 of the chip. An area of the absorption layer 19 corresponding to the photosensitive area 22 is a photoelectric conversion area. The incident light enters the chip for photoelectric conversion in the photoelectric conversion area, so as to generate a photocurrent, and monitor the optical power.

The photosensitive areas 22 of the multiple light splitting monitoring units are arranged at intervals, i.e., the photoelectric conversion areas of the multiple light splitting monitoring units are spaced, so that each beam of incident light entering the photoelectric conversion area of the corresponding light splitting monitoring unit undergoes separate photoelectric conversion. Each light splitting monitoring unit separately monitors optical power of each beam of incident light without interfering with each other.

The first electrode 23 is arranged on the front of the chip and connected to the other end of the corresponding photosensitive area 22, and the first electrodes 23 of the multiple light splitting monitoring units are insulated from each other.

An edge of the front of the chip is further provided with multiple electrode pads 24 in one-to-one correspondences with the light splitting monitoring units, and the first electrode 23 of each of the light splitting monitoring units is electrically connected to the corresponding electrode pad 24 through one corresponding electrode connecting wire 25. The multiple electrode connecting wires 25 are insulated from each other; and the multiple electrode pads 24 are insulated from each other. Specifically, a center-to-center spacing between adjacent two of the electrode pads 24 is greater than 30 μm and less than 1000 μm; and a spacing between adjacent two of the electrode connecting wires 25 is greater than 5 μm.

In this embodiment, each electrode pad 24 is circular.

The electrode pads 24 are configured to be electrically connected to other components (such as circuit boards) through bond wires, so as to power up the chip. The electrode pads 24 are distributed on the edge of the chip, and the bond wires are easy to bond.

In this embodiment, the multiple electrode pads 24 are distributed on the four edges of the chip, and the electrode pads 24 at each edge are distributed in a single row (a row is in a direction parallel with the edge of the chip), which facilitates maintenance.

Figure 18:
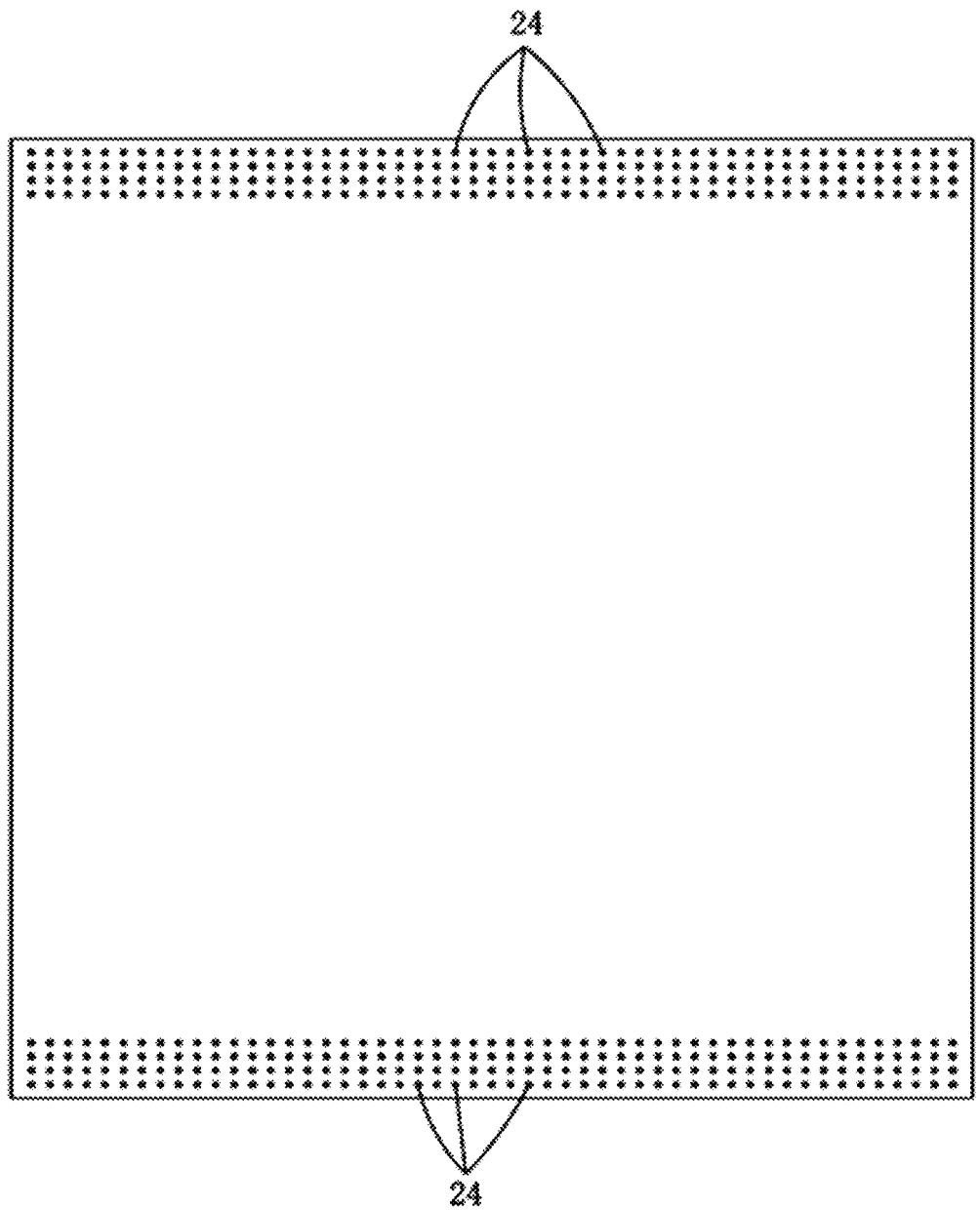
FIG. 18 is a schematic diagram illustrating another embodiment of distribution of electrode pads of a photoelectric chip according to the present invention.

In another embodiment, referring to FIG. 18, the multiple electrode pads 24 are distributed on two opposite edges of the chip. When the electrode pads 24 are connected to other components by bond wires, such a structure of this structure is easy to connect.

Figure 19:
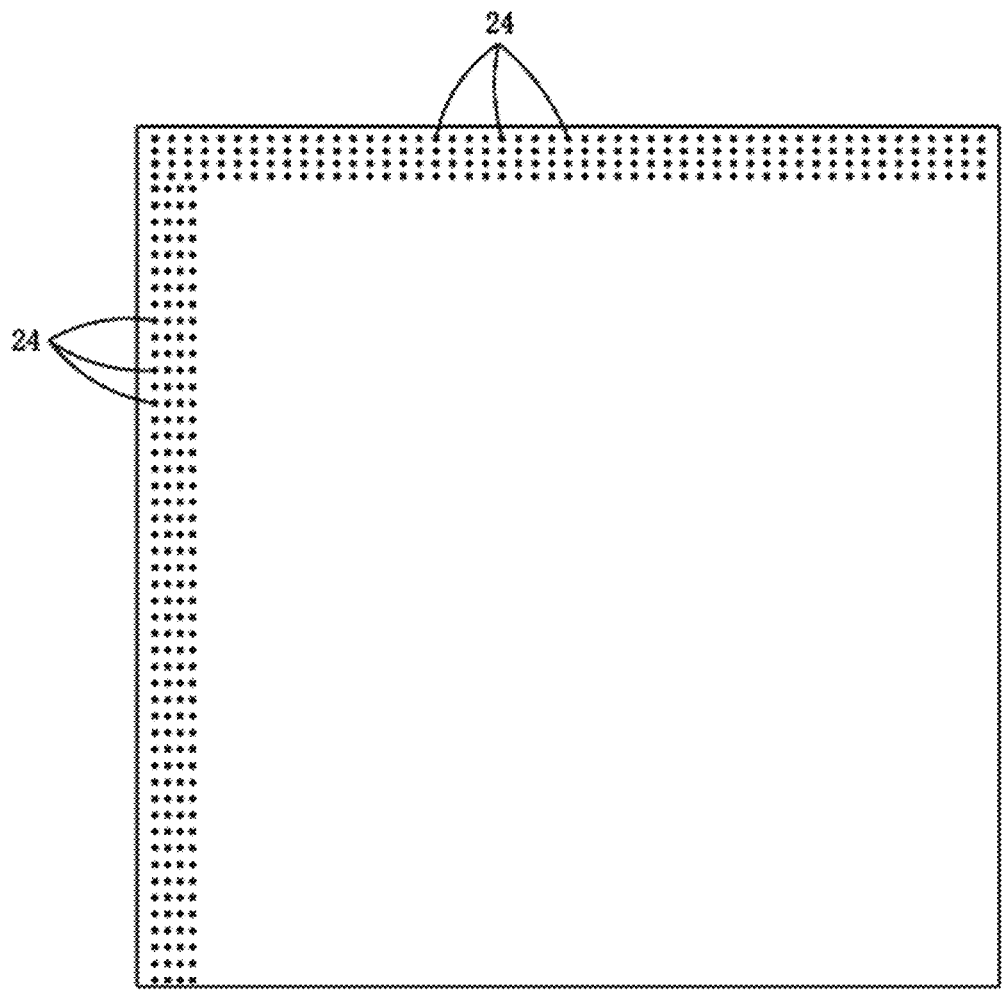
FIG. 19 is a schematic diagram illustrating still another embodiment of distribution of electrode pads of a photoelectric chip according to the present invention.

In still another embodiment, referring to FIG. 19, the multiple electrode pads 24 are distributed on two adjacent edges of the chip.

Figure 20:
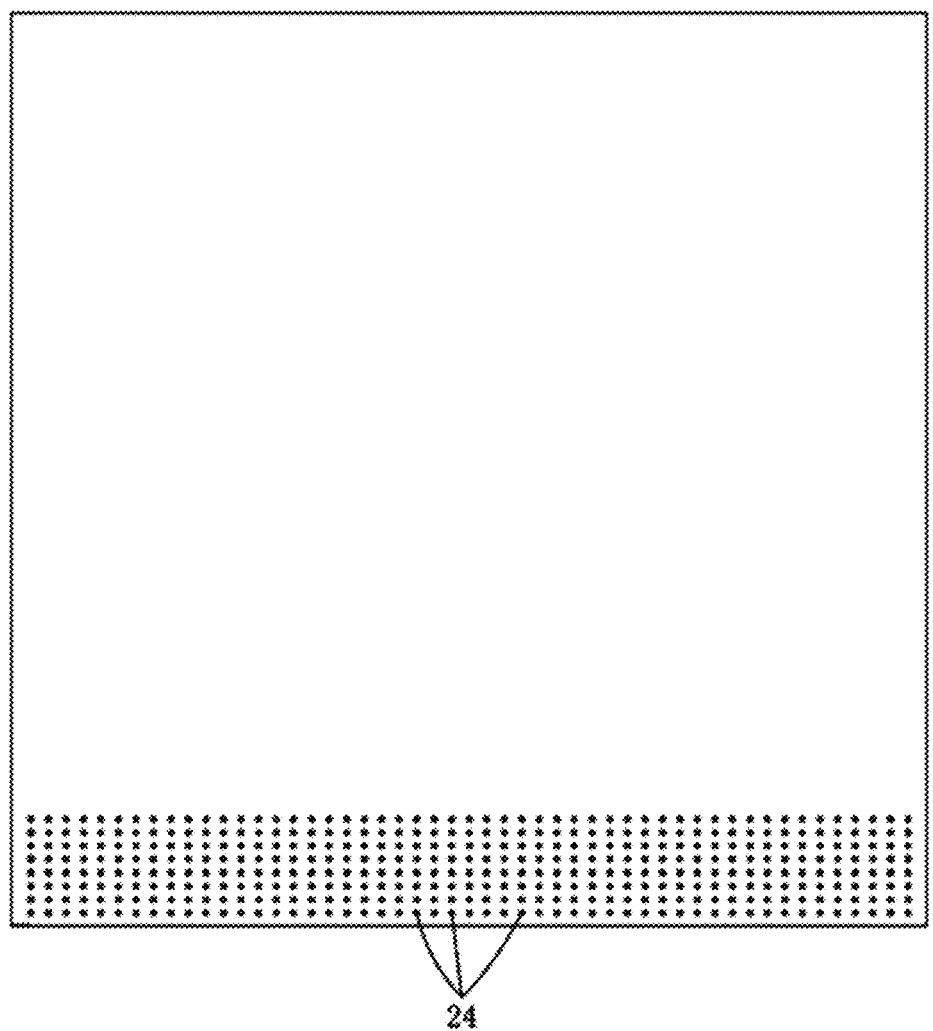
FIG. 20 is a schematic diagram illustrating yet another embodiment of distribution of electrode pads of a photoelectric chip according to the present invention.

In yet another embodiment, referring to FIG. 20, the multiple electrode pads 24 are distributed on one edge of the chip.

At least one second electrode 26 is arranged on the back of the chip, and the second electrode 26 is connected to the substrate 17 of the chip.

The first electrode 23 and the second electrode 26 are configured to be connected to two poles of a power supply to power up the chip.

The first electrode 23 in the embodiment of the chip provided in the present invention is arranged on the front of the chip, and the second electrode 26 is located on the back of the chip. In practice, when the chip is powered up, each electrode pad 24 is electrically connected to a first circuit board through a bond wire. The back of the chip is provided with a first circuit board that is transparent (to avoid affecting entry of the incident light into the chip). The first circuit board is provided with a circuit trace, and the second electrode 26 is electrically connected to the circuit trace on the second circuit board. Then the first circuit board and the second circuit board are electrically connected to two poles of a power supply, so as to power up the chip.

The back of the chip is used as a light-entering side. In this embodiment, the back of the chip is provided with multiple light-entering anti-reflection coatings 27 in one-to-one correspondences to the light splitting monitoring units to reduce light reflection and increase an incidence rate. An area of each of the light-entering anti-reflection coatings 27 is greater than the sum of cross-sectional areas of both the light-transmitting groove 21 and the photosensitive area 22 of the corresponding light splitting monitoring unit in a direction parallel with the surface of the chip, so that after each beam of incident light enters the chip from the corresponding light-entering anti-reflection coating 27, the light can be split by the light-transmitting groove 21 of the corresponding light splitting monitoring unit and enter the corresponding photoelectric conversion area for photoelectric conversion.

In this embodiment, the back of the chip is provided with only one second electrode 26, and the second electrode 26 is provided with multiple second electrode through holes in one-to-one correspondences with the light-entering anti-reflection coatings 27, and each of the light-entering anti-reflection coatings 27 is located in the corresponding second electrode through hole.

An inner end of the light-transmitting groove 21 is provided with a light-exiting anti-reflection coating 12 to reduce reflection of light and increase a light transmittance.

In this embodiment, cross sections of the first electrode 23 and the photosensitive area 22 of each light splitting monitoring unit in a direction parallel with the surface of the chip are both annular, and the light-transmitting groove 21 and the light-entering anti-reflection coating 27 of each light splitting monitoring unit are circular. The light-transmitting groove 21, the first electrode 23, the photosensitive area 22 and the light-entering anti-reflection coating 27 of each light splitting monitoring unit are all concentric circles, each with a circle center alignment error being less than 20 μm. The light-transmitting groove 21 has a diameter of 50-250 μm, the first electrode 23 has an inner diameter not less than the diameter of light-transmitting groove 21, and the first electrode 23 has an outer diameter greater than the diameter of the light-transmitting groove 21 and is 60-1000 μm. The outer diameter of the first electrode 23 is not greater than a diameter of the light-entering anti-reflection coating 27; and the photosensitive area 22 has an inner diameter not greater than that of the first electrode 23, and the photosensitive area 22 has an outer diameter not greater than that of the first electrode 23. The inner diameter of the photosensitive area 22 is not less than the diameter of the light-transmitting groove 21, and the outer diameter of the photosensitive area 22 is not greater than the diameter of the light-entering anti-reflection coating 27.

The front of the photoelectric chip provided in the present invention is further provided with a passivation coating 29, where the passivation coating 29 is located on a surface of the top layer 20 that faces away from the absorption layer 19. The passivation coating 29 is provided with multiple first electrode through holes in one-to-one correspondences with the first electrodes 23 of the light splitting monitoring units, and the first electrode 23 of each light splitting monitoring unit is located in the corresponding first electrode through hole.

A working principle of the photoelectric chip provided in the present invention is as follows: A reverse bias voltage is applied to the chip through the second electrode 26 and through the first electrode 23 of each light splitting monitoring unit, so that the chip operates.

Multiple beams of incident light enter the chip from the corresponding light-entering anti-reflection coating 27 on the back of the chip. One part 31 of each beam of incident light 30 passes through the substrate 17 and the buffer layer 18 and then is transmitted and split out through the light-transmitting groove 21 of the corresponding light splitting monitoring unit, and this part of the light can pass through the chip while maintaining a high transmittance, and can continue optical signal transmission. The other part 32 of each beam of incident light 30 passes through the substrate 17 and the buffer layer 18 and enters the photoelectric conversion area of the corresponding light splitting monitoring unit for photoelectric conversion to form a photocurrent, and then corresponding optical power is calculated through a series of other external circuits and devices and displayed, so as to monitor the optical power of the incident light.

A light intensity of each beam of incident light generally exhibits a Gaussian distribution, i.e., the light intensity is strong in the middle and weak on both sides, most of each beam of incident light may exit through the inner end of the light-transmitting groove 21, and thus most of the light can continue optical signal transmission. Only a small part of each beam of incident light enters the absorption layer 19 for photoelectric conversion.

A proportion of light that needs to be split out from each beam of incident light is determined based on actual needs. For example, in this embodiment, the proportion of light that needs to be split out from each beam of incident light is 10%. When an optical link is installed, a detection element may be used to detect optical power of the light split out through the light-transmitting groove 21 of the corresponding light splitting monitoring unit. Because the total optical power of each beam of incident light is known (the total optical power of an output of a light source is known, or the total optical power is measured separately), it can be determined whether the proportion of the light split out meets a requirement.

If the requirement is met, relevant components on the optical link may be fixed.

If the requirement is not met, a distance between the light source of each beam of incident light and the chip may be adjusted to adjust the proportion of the light split out from each beam of incident light.

After the proportion of the light split out from each beam of incident light is determined, the remaining light of each beam of light may enter the absorption layer 19 of the chip for photoelectric conversion to generate a photocurrent, and optical power of the remaining light of each beam of light is calculated based on the generated photocurrent, so as to monitor the optical power of each beam of incident light. It may be considered that a splitting ratio of each beam of light has been determined after installation. The optical power of the part of each beam of light that enters the chip to generate the photocurrent may directly represent a change rate of the optical power of each light source. If a real-time change value of the total optical power of each beam of incident light is required subsequently, it may be chosen to obtain the value through conversion according to the light splitting proportion based on the optical power of each beam of light calculated from the photocurrent in the embodiment.

The present invention further provides an embodiment of a manufacturing method for a photoelectric chip, where the manufacturing method is used to manufacture the back-incident array photoelectric chip described in any one of the above-mentioned embodiments, and includes the following steps.

Figure 21:
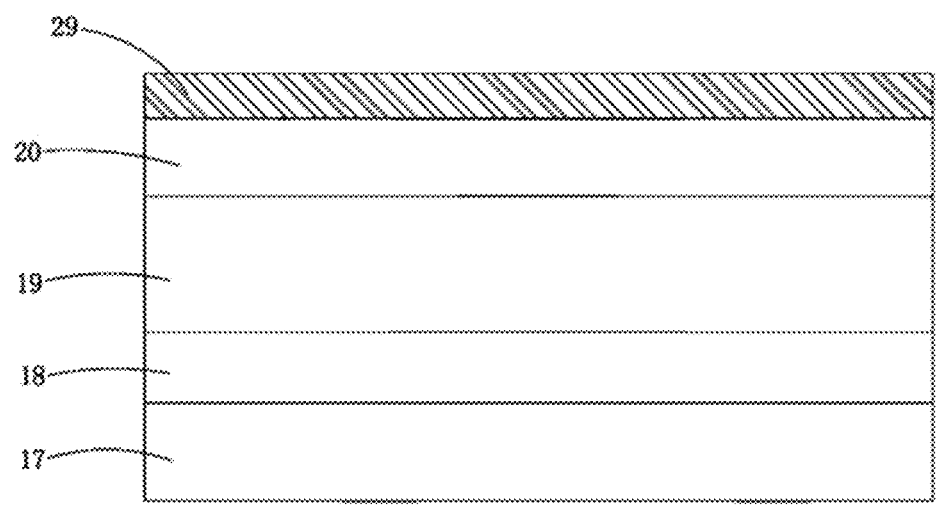
FIG. 21 is a schematic diagram illustrating growth of a substrate, a buffer layer, an absorption layer, a top layer and a passivation coating according to an embodiment of the present invention.

Referring to FIG. 21, a buffer layer 18, an absorption layer 19 and a top layer 20 are sequentially grown on a substrate 17; and in this embodiment, MOCVD or other optional processes in the art may be used.

A growing dielectric film process or other optional processes in the art may be optionally used to grow a passivation coating 29 on the front of the chip, i.e., the passivation coating 29 is located on a surface of the top layer 20 that faces away from the absorption layer 19. Specifically, the growing dielectric film process is PECVD, and the passivation coating 29 is made of silicon dioxide ($SiO_2$) with a thickness greater than 5000 A or silicon nitride ($Si_3N_4$) with a thickness greater than 2000 A.

Figure 22:
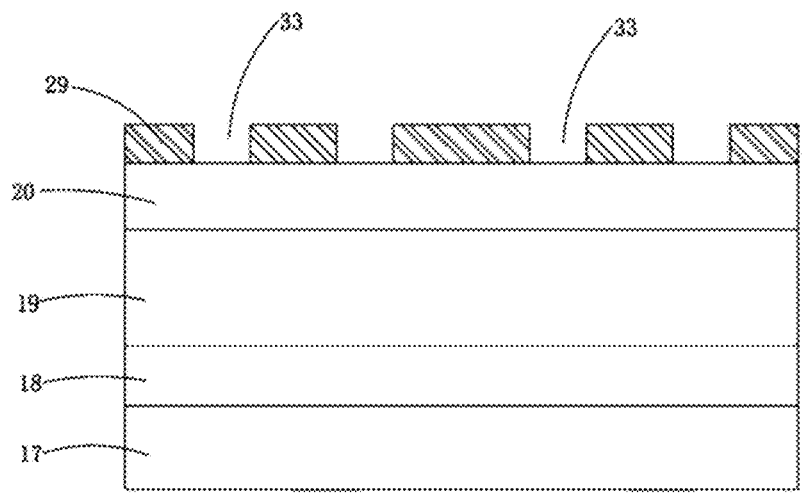
FIG. 22 is a schematic diagram illustrating photolithography and etching of a photosensitive area window according to an embodiment of the present invention.

Referring to FIG. 22, a photolithography and etching process is used to form multiple photosensitive area windows 33 on the passivation coating 29 through photolithography and etching.

Figure 23:
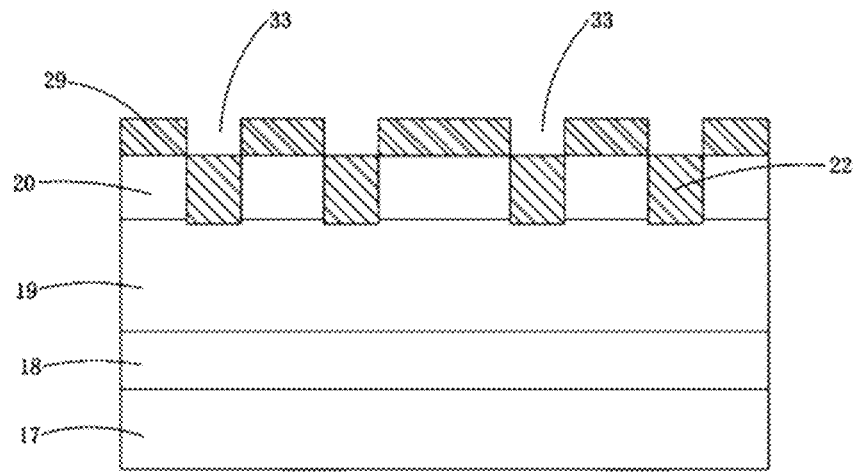
FIG. 23 is a schematic diagram illustrating a photosensitive area formed by diffusion according to an embodiment of the present invention.

Referring to FIG. 23, a P-type material is doped in multiple places on the top layer 20 from each photosensitive area window 33, the P-type material in each place diffuses to the absorption layer 19 to form multiple photosensitive areas 22, and a high temperature diffusion process is used to form a PN junction. Specifically, the top layer 20 is doped with the P-type material using a diffusion process, and a diffusion source is zinc phosphide ($Zn_3P_2$).

Figure 24:
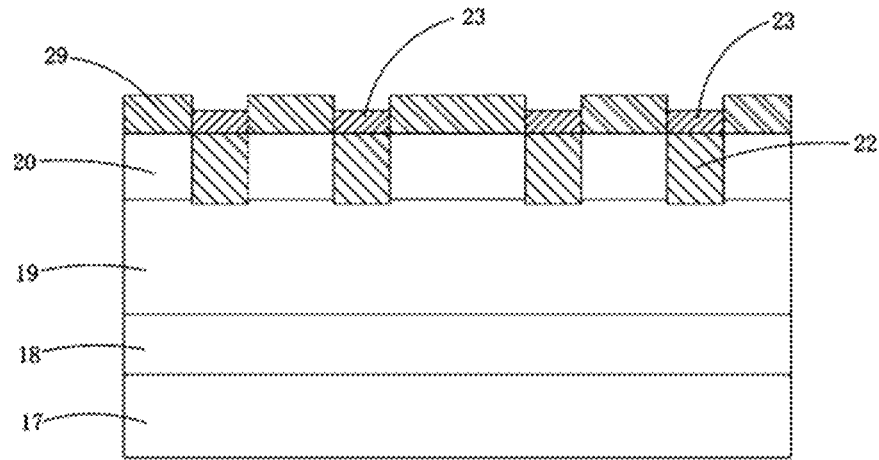
FIG. 24 is a schematic diagram illustrating manufacturing of a first electrode according to an embodiment of the present invention.

Referring to FIG. 24, multiple first electrodes 23 are manufactured on the front of the chip, and each of the first electrodes 23 is connected to the corresponding photosensitive area 22. Specifically, the first electrode 23 is manufactured by using an electron beam evaporation process, and the first electrode 23 is a TiPtAu metal electrode.

Figure 25:
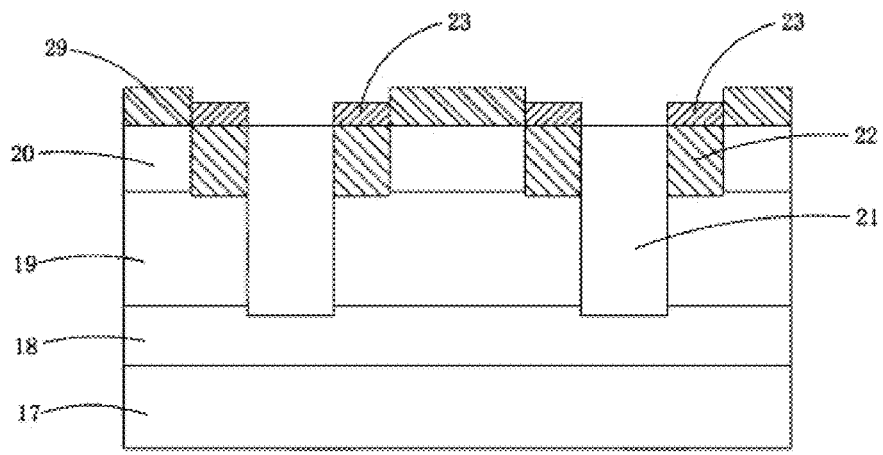
FIG. 25 is a schematic diagram illustrating forming of a light-transmitting groove according to an embodiment of the present invention.

Referring to FIG. 25, multiple light-transmitting grooves 21 are formed on the chip, and the light-transmitting grooves 21 are open towards the front of the chip. The multiple light-transmitting groove 21 run through the absorption layer 19 and the top layer 20, and an inner end of the light-transmitting groove 21 is located at the buffer layer 18. Specifically, the light-transmitting groove 21 is etched by using a wet etching process or a dry etching process.

Figure 26:
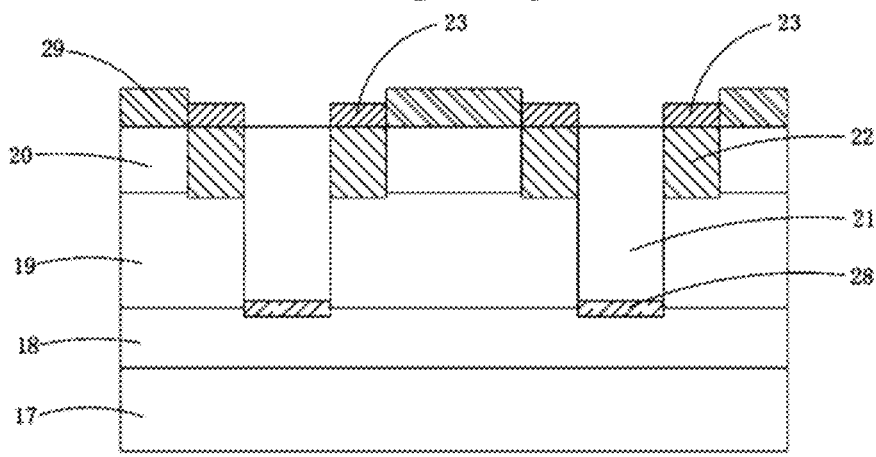
FIG. 26 is a schematic diagram illustrating growth of a light-exiting anti-reflection coating according to an embodiment of the present invention.

Referring to FIG. 26, a light-exiting anti-reflection coating 28 is grown at the inner end of the light-transmitting groove 21. Specifically, PECVD is used to grow an anti-reflection coating on the front of the chip, photolithography and etching are performed on the anti-reflection coating, and the anti-reflection coating at the inner end of the light-transmitting groove 21 is retained to form the light-exiting anti-reflection coating 28.

The back of the chip is thinned and polished.

Figure 27:
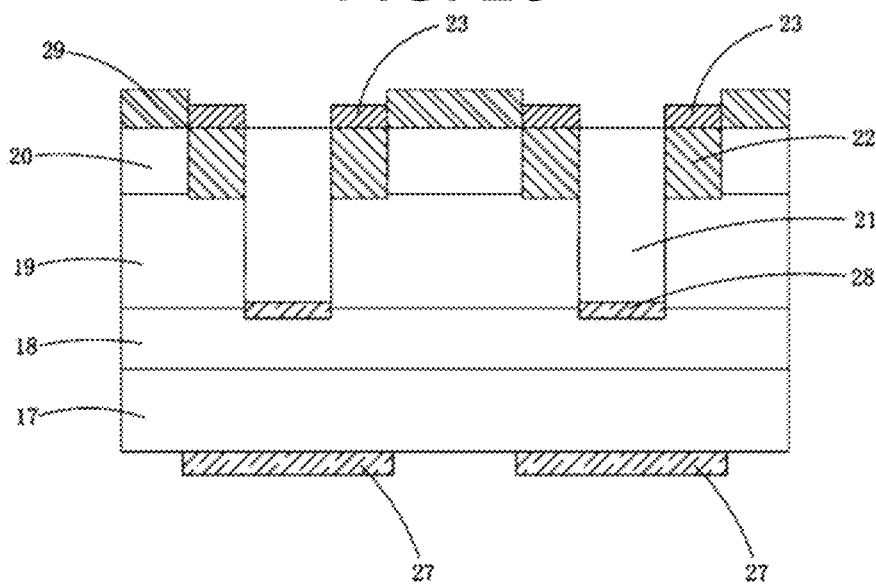
FIG. 27 is a schematic diagram illustrating growth of a light-entering anti-reflection coating according to an embodiment of the present invention.

Referring to FIG. 27, multiple light-entering anti-reflection coatings 27 are grown on the back of the chip, and each light-entering anti-reflection coatings 27 corresponds to one light splitting monitoring unit. Specifically, anti-reflection coatings are grown on the back of the chip, and multiple light-entering anti-reflection coatings 27 are formed through photolithography.

Figure 28:
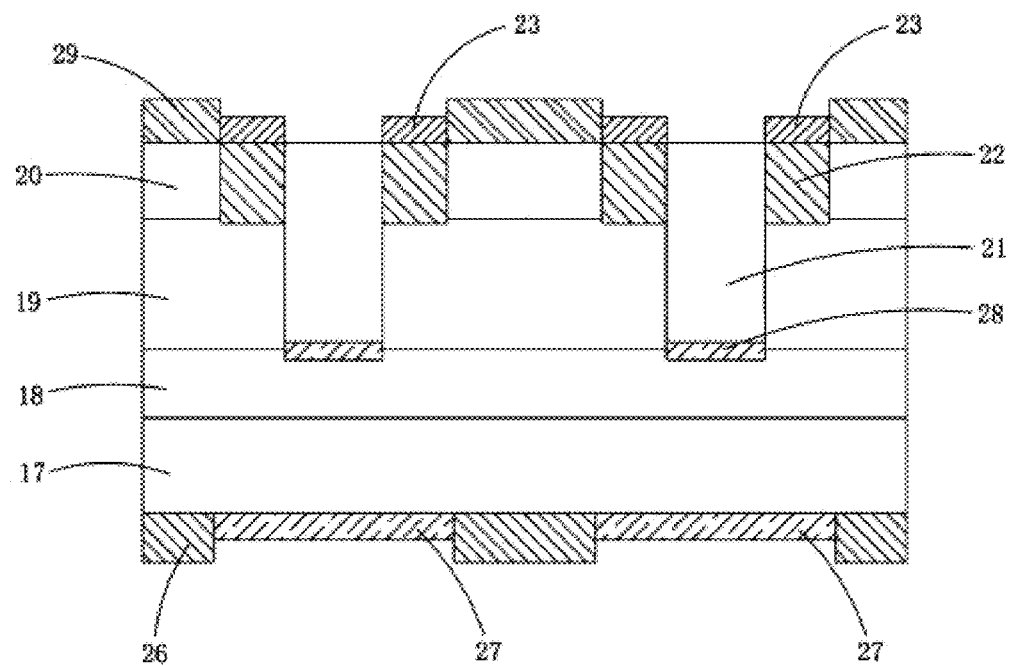
FIG. 28 is a schematic diagram illustrating manufacturing of a second electrode according to an embodiment of the present invention.

Referring to FIG. 28, a second electrode 26 is manufactured on the back of the chip, and multiple second electrode through holes for arranging the light-entering anti-reflection coatings 27 are formed on the second electrode 26. Specifically, the second electrode 26 is manufactured by using an electron beam evaporation process and is a NiAu metal electrode, and multiple second electrode through holes are formed through photolithography.

A contact resistance of the chip is reduced by using a high-temperature alloy process.

The photoelectric chip provided in the present invention is provided with the multiple light splitting monitoring units, and each of the light splitting monitoring units includes a light-transmitting groove 21 and a photosensitive area 22. Multiple beams of incident light are emitted to the chip. One part 31 of each beam of incident light is transmitted and split out from the light-transmitting groove 21 of the corresponding light splitting monitoring unit, and this part of light can pass through the chip losslessly through the light-splitting groove 21 without passing through the absorption layer 19, and can continue optical signal transmission. The other part 32 of each beam of incident light enters the photoelectric conversion area of the corresponding light splitting monitoring unit for photoelectric conversion, so that the chip can separately perform splitting and optical power monitoring on the multiple beams of incident light. Therefore, an optical path system using the chip does not need to use a large number of optical splitters, thereby greatly reducing a size and cost of the optical path system.

It should be noted that relational terms such as "first" and "second" herein are only used to distinguish one entity or operation from another entity or operation, and do not necessarily require or imply the presence of any such actual relationship or order between these entities or operations. Moreover, the term "comprise", "include", or any other variant thereof is intended to cover a non-exclusive inclusion, so that a process, method, article, or device that includes a series of elements includes not only those elements, but also other elements not explicitly listed, or elements that are inherent to such a process, method, article, or device. Without more restrictions, an element defined by the phrase "including a . . . " does not exclude the presence of another same element in a process, method, article, or device that includes the element.

The features mentioned above in the specification, accompanying drawings and claims may be randomly combined with each other as long as they are meaningful within the present invention. The features and advantages described based on a sample analysis system in the present invention are applicable to a sample analysis method in the present invention in a corresponding manner, and vice versa.

The above are only specific implementations of the present invention for a person skilled in the art to understand or implement the present invention. Various modifications to these embodiments will be readily figured out by a person skilled in the art, and the general principles defined herein may be implemented in other embodiments without departing from the spirit or scope of the present invention. Therefore, the present invention will not be limited to the embodiments shown herein, but should conform to the widest scope consistent with the principles and novel features applied herein.

What is claimed is:

1. A photoelectric chip, which is a back-incident photoelectric chip, wherein the chip is provided with a light-splitting groove, and the light-splitting groove runs through an absorption layer of the chip; and
   a back of the chip is a light-entering side; the light-splitting groove is configured to transmit and split out one part of incident light, and the other part of the incident light enters the absorption layer for photovoltaic conversion,
   wherein the chip further comprising:
   a top layer, wherein the top layer is located on one side of a front of the absorption layer; the light-splitting groove is open in a direction away from the back of the chip and runs through the top layer, and a photosensitive area of the chip is formed in the top layer; an inner end of the photosensitive area is connected to the absorption layer, and an outer end of the photosensitive area is connected to a first electrode of the chip; the photosensitive area corresponds to an area in the absorption layer for performing photoelectric conversion; and the first electrode is located on the front of the chip.

2. The chip according to claim 1, further comprising:
   a substrate, wherein the substrate is located on one side of a back of the absorption layer; and the back of the chip is further provided with a second electrode, and the second electrode is arranged on an outer edge of a back surface of the substrate.

3. The chip according to claim 2, wherein a buffer layer is further arranged between the substrate and the absorption layer, and an inner end of the light-splitting groove is located at the buffer layer.

4. The chip according to claim 1, wherein the back of the chip is provided with a light-entering anti-reflection coating to increase an incidence rate, and an area of the light-entering anti-reflection coating is greater than a cross-sectional area of the light-splitting groove parallel with a surface of the chip.

5. The chip according to claim 3, wherein the inner end of the light-splitting groove is provided with a light-transmitting anti-reflection coating to increase a light-exiting transmittance.

6. The chip according to claim 4, wherein cross sections of the first electrode and the photosensitive area in a direction parallel with the surface of the chip are both annular, and the light-splitting groove and the light-entering anti-reflection coating are both circular;
  the light-splitting groove, the first electrode, the photosensitive area and the light-entering anti-reflection coating are all concentric circles, each with a circle center alignment error being less than 20 µm;
  the light-splitting groove has a diameter of 50 µm-250 µm;
  the first electrode has an inner diameter not less than the diameter of the light-splitting groove, and the first electrode has an outer diameter greater than the diameter of the light-splitting groove and is 60 µm-1000 µm; and
  the photosensitive area has an inner diameter not less than the diameter of the light-splitting groove, and the photosensitive area has an outer diameter not greater than the diameter of the light-entering anti-reflection coating.

7. The chip according to claim 1, wherein the light-splitting groove runs through a part of the chip or the entire chip.

8. A photoelectric chip, which is a back-incident array photoelectric chip, wherein the chip comprises multiple light splitting monitoring units, and each of the light splitting monitoring units comprises a light-transmitting groove and a photosensitive area; the light-transmitting groove is open towards any surface of the chip and runs through an absorption layer of the chip, the photosensitive area is formed in a top layer of the chip, and one end of the photosensitive area is connected to the absorption layer of the chip; and an area of the absorption layer corresponding to the photosensitive area is a photoelectric conversion area; and
  a back of the chip is used as a light-entering side, and multiple beams of incident light are emitted to the chip; one part of each beam of incident light is transmitted and split out from the light-transmitting groove of the corresponding light splitting monitoring unit, and the other part of each beam of incident light enters the photoelectric conversion area of the corresponding light splitting monitoring unit for photoelectric conversion.

9. The chip according to claim 8, wherein each of the light splitting monitoring units further comprises a first electrode, and the first electrode is arranged on a front of the chip and connected to the other end of the corresponding photosensitive area;
  the first electrodes of the multiple light splitting monitoring units are insulated from each other; and
  at least one second electrode is arranged on the back of the chip, and the second electrode is connected to the substrate of the chip.

10. The chip according to claim 9, wherein an edge of the front of the chip is further provided with multiple electrode pads in one-to-one correspondences with the light splitting monitoring units, and the first electrode of each of the light splitting monitoring units is electrically connected to the corresponding electrode pad through one corresponding electrode connecting wire;
  the multiple electrode connecting wires are insulated from each other; and
  the multiple electrode pads are insulated from each other.

11. The chip according to claim 9, wherein a buffer layer is further arranged between the substrate and the absorption layer, the light-splitting groove is open towards the front of the chip and further runs through the top layer, and an inner end of the light-splitting groove is located at the buffer layer.

12. The chip according to claim 8, wherein a center-to-center spacing between adjacent two of the light splitting monitoring units is greater than 100 µm and less than 5000 µm.

13. The chip according to claim 10, wherein a center-to-center spacing between adjacent two of the electrode pads is greater than 30 µm and less than 1000 µm; and a spacing between adjacent two of the electrode connecting wires is greater than 5 µm.

14. The chip according to claim 8, wherein the light-transmitting groove runs through a part of the chip or the entire chip.

15. The chip according to claim 8, wherein the back of the chip is provided with multiple light-entering anti-reflection coatings in one-to-one correspondences with the light splitting monitoring units, and an area of each of the light-entering anti-reflection coatings is greater than a sum of cross-sectional areas of both the light-transmitting groove and the photosensitive area of the corresponding light splitting monitoring unit in a direction parallel with the surface of the chip.

16. The chip according to claim 11, wherein the inner end of the light-transmitting groove is provided with a light-exiting anti-reflection coating.

* * * * *